(12) United States Patent
Hose et al.

(10) Patent No.: US 8,410,578 B2
(45) Date of Patent: Apr. 2, 2013

(54) METHOD OF MANUFACTURING A SEMICONDUCTOR COMPONENT AND STRUCTURE

(75) Inventors: Sallie Hose, Gresham, OR (US); Peter A. Burke, Portland, OR (US); Li Jiang, Laveen, AZ (US); Sudhama C. Shastri, Phoenix, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 205 days.

(21) Appl. No.: 12/962,579

(22) Filed: Dec. 7, 2010

(65) Prior Publication Data

US 2011/0079876 A1 Apr. 7, 2011

Related U.S. Application Data

(60) Continuation-in-part of application No. 12/902,130, filed on Oct. 11, 2010, now Pat. No. 7,981,757, which is a division of application No. 12/549,100, filed on Aug. 27, 2009, now Pat. No. 7,829,426, which is a continuation of application No. 11/618,363, filed on Dec. 29, 2006, now Pat. No. 7,602,027.

(51) Int. Cl.
  *H01L 29/94* (2006.01)
  *H01L 21/02* (2006.01)
  *H01L 21/768* (2006.01)

(52) U.S. Cl. ......... 257/532; 257/E29.345; 257/E21.022; 257/E21.579; 257/531; 438/381

(58) Field of Classification Search .................. 257/532, 257/531, E29.345, E21.579, E21.022; 438/381
  See application file for complete search history.

(56) References Cited

U.S. PATENT DOCUMENTS

| | | | | |
|---|---|---|---|---|
| 6,573,148 B1 * | 6/2003 | Bothra | ......................... | 438/381 |
| 7,068,139 B2 * | 6/2006 | Harris et al. | .................. | 336/200 |
| 2003/0235710 A1 * | 12/2003 | Grill et al. | ...................... | 428/641 |
| 2004/0188674 A1 * | 9/2004 | Gates et al. | ...................... | 257/40 |
| 2005/0224888 A1 * | 10/2005 | Graham et al. | ................ | 257/368 |
| 2006/0284250 A1 * | 12/2006 | Hsu et al. | ....................... | 257/347 |
| 2008/0050890 A1 * | 2/2008 | Hsu et al. | ....................... | 438/479 |
| 2009/0236691 A1 * | 9/2009 | Dyer et al. | ..................... | 257/532 |

* cited by examiner

*Primary Examiner* — Victor A Mandala
(74) *Attorney, Agent, or Firm* — Rennie William Dover

(57) ABSTRACT

A semiconductor component and methods for manufacturing the semiconductor component that includes a monolithically integrated passive device. In accordance with embodiments, the monolithically integrated passive device includes an inductor formed from damascene structures.

19 Claims, 40 Drawing Sheets

METHOD OF MANUFACTURING A SEMICONDUCTOR COMPONENT AND STRUCTURE

The present application is a continuation-in-part of parent U.S. patent application Ser. No. 12/902,130 filed on Oct. 11, 2010 now U.S. Pat. No. 7,981,757, by Peter A. Burke et al., titled "Semiconductor Component and Method of Manufacture," which is a divisional application of parent U.S. patent application Ser. No. 12/549,100, filed on Aug. 27, 2009, now U.S. Pat. No. 7,829,426 B2, which is a continuation application of parent U.S. patent application Ser. No. 11/618,363, filed on Dec. 29, 2006, now U.S. Pat. No. 7,602,027 B2, all of which are hereby incorporated by reference, and priority thereto for common subject matter is hereby claimed.

BACKGROUND

The present invention relates, in general, to semiconductor components and, more particularly, to semiconductor components that include one or more integrated passive circuit elements.

Semiconductor component manufacturers are constantly striving to increase the functionality and performance of their products, while decreasing their cost of manufacture. One approach for increasing functionality and performance has been to increase the number of circuit elements manufactured from a semiconductor wafer. As those skilled in the art are aware, a semiconductor wafer is divided into a plurality of areas or regions called chips or dice. Identical circuit elements are manufactured in each chip. Increasing the number of chips in a semiconductor wafer lowers the cost of manufacturing semiconductor components. However, a drawback with integrating a larger number of circuit elements in a semiconductor wafer is that it increases the area occupied by each chip and thereby decreases the number of chips that can be manufactured from a single semiconductor wafer. Integrating passive circuit elements in a semiconductor material further increases the chip size because they occupy large areas compared to, for example, active devices. Thus, in lowering manufacturing costs semiconductor component manufacturers trade off the number of circuit elements that can be manufactured in a chip with the number of chips that can be obtained from a semiconductor wafer.

Another drawback with monolithically integrating passive circuit elements in a semiconductor chip is that the tools for manufacturing passive circuit elements are optimized for manufacturing larger geometry devices whereas the tools for manufacturing active circuit elements are optimized for manufacturing smaller geometry devices. For example, equipment used in the manufacture of passive circuit elements is precise to within a tenth of a micron whereas equipment used for manufacturing active circuit elements is precise to within a thousandth of a micron.

Accordingly, it would be advantageous to have a method for manufacturing passive circuit elements in a semiconductor chip that is area and cost efficient. It would be of further advantage to be able to use common equipment or toolsets for manufacturing passive circuit elements as are used to manufacture active circuit elements.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
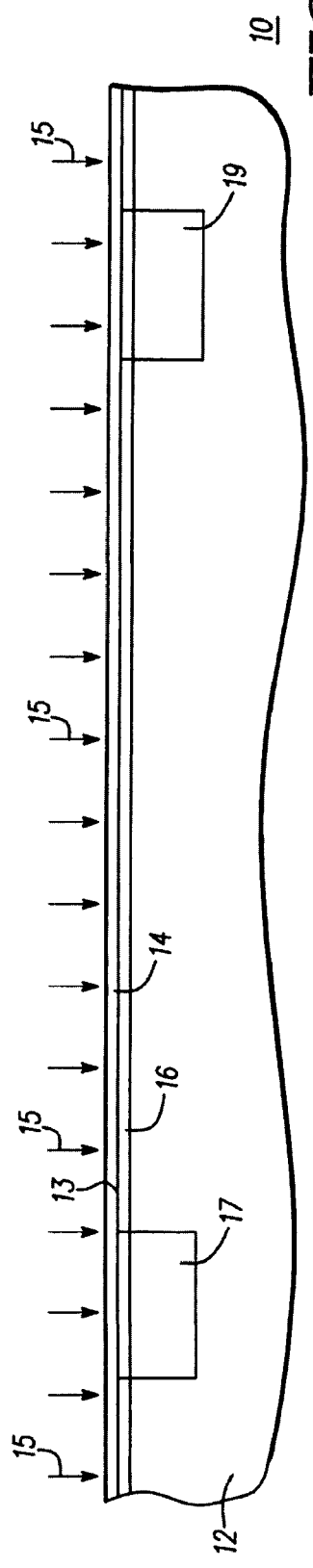
FIG. 1 is a cross-sectional view of a semiconductor component during an early stage of manufacture in accordance with an embodiment of the present invention.

For simplicity and clarity of the illustrations, elements in the figures are not necessarily drawn to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles. In addition, the terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

DETAILED DESCRIPTION

FIG. 1 is a cross-sectional view of a portion of a semiconductor component 10 during manufacture in accordance with an embodiment of the present invention. What is shown in FIG. 1 is a semiconductor material 12 having a major surface 13. An active device 17 and a passive device 19 are formed from semiconductor material 12. Techniques for forming active devices in or on semiconductor material 12 are known to those skilled in the art. Active device 17 may be a diode, a Zener diode, a field effect transistor, a bipolar transistor, or the like, and passive device 19 may be a resistor, a capacitor, an inductor, or the like. Although only a single active device and a single passive device have been described, it should be understood that one or more active and passive devices may be formed from semiconductor material 12. Alternatively, semiconductor material 12 may be devoid of active devices, passive devices, or active and passive devices. In accordance with an embodiment of the present invention, semiconductor material 12 is silicon doped with an impurity material of P-type conductivity such as, for example, boron. By way of example, the resistivity of semiconductor material 12 ranges from about 1,000 Ohm-centimeters ($\Omega$-cm) to about 10,000 $\Omega$-cm. Although semiconductor material 12 may be a high resistivity substrate, the resistivity or dopant concentration of semiconductor material 12 is not a limitation of the present invention. Likewise, the type of material for semiconductor material 12 is not limited to being silicon and the conductivity type of semiconductor material 12 is not limited to being P-type conductivity. It should be understood that an impurity material is also referred to as a dopant or impurity species. Other suitable materials for semiconductor material 12 include polysilicon, germanium, silicon germanium, Semiconductor-On-Insulator ("SOI") material, and the like. In addition, semiconductor material 12 can be comprised of a compound semiconductor material such as Group III-V semiconductor materials, Group II-VI semiconductor materials, etc.

Optionally, semiconductor material 12 may be treated to increase the Q-factor of semiconductor devices that are comprised of one or more inductors. By way of example, a portion of semiconductor material 12, such as, for example, the surface of semiconductor material 12, may be made amorphous to reduce the interaction between the electromagnetic field and active elements formed in semiconductor material 12. In accordance with embodiments of the present invention, the portion of semiconductor material 12 may be made amorphous by cleaning surface 13, forming a low temperature oxide 14 on surface 13, implanting an implantation species such as, for example, Argon, or the like, into semiconductor material 12 to form an amorphous layer 16. Implanting the implantation species is indicated by arrows 15.

Figure 2:
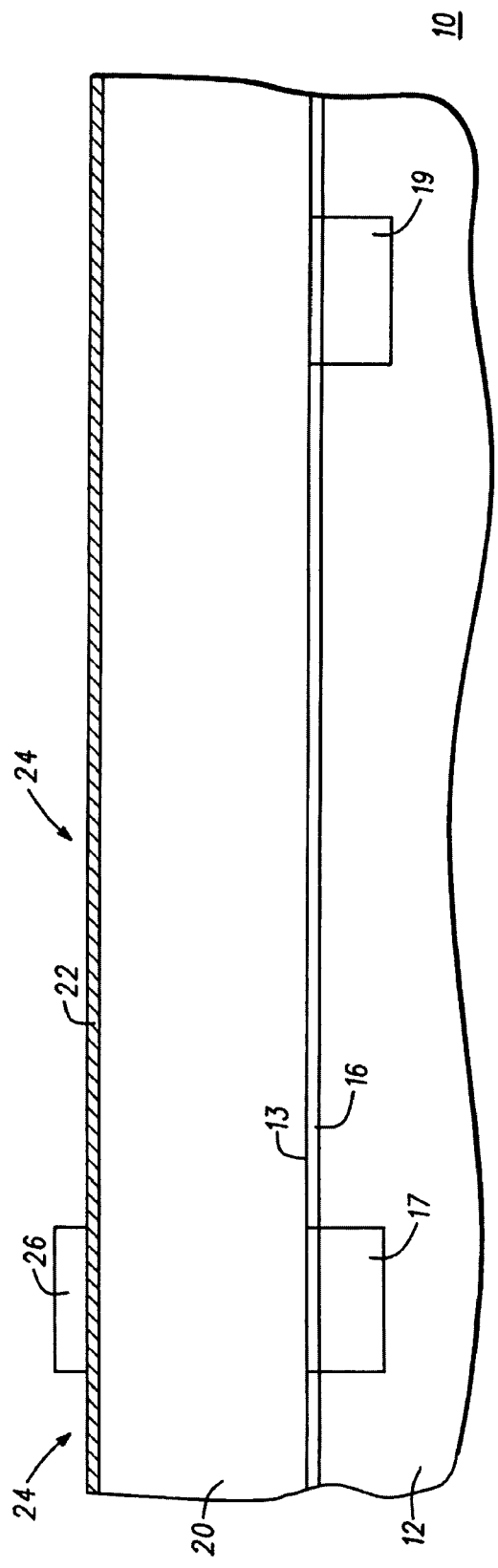
FIG. 2 is a cross-sectional view of the semiconductor component of FIG. 1 at a later stage of manufacture.

Referring now to FIG. 2, oxide layer 14 is removed and a layer of dielectric material 20 having a thickness ranging from about 1,000 Angstroms (Å) to about 60,000 Å is formed on surface 13. In accordance with an embodiment of the present invention, dielectric material 20 is formed by Plasma Enhanced Chemical Vapor Deposition (PECVD) to form an oxide layer having a thickness of about 50,000 Å. Alternatively, dielectric layer 20 may be formed by decomposition of tetraethylorthosilicate (TEOS) or as a spin-on dielectric material. The type of material for dielectric layer 20 is not a limitation of the present invention. A layer of electrically conductive material 22 is formed on dielectric layer 20. By way of example electrically conductive layer 22 is titanium nitride (TiN) having a thickness ranging from about 250 Å to about 3,000 Å. Other suitable materials for electrically conductive layer 22 include tantalum (Ta), tantalum nitride (TaN), titanium tungsten (TiW), or the like. A layer of photoresist is formed on electrically conductive layer 22 and patterned to have openings 24 that expose portions of electrically conductive layer 22. The remaining portions of the photoresist layer serve as a masking structure 26.

Figure 3:
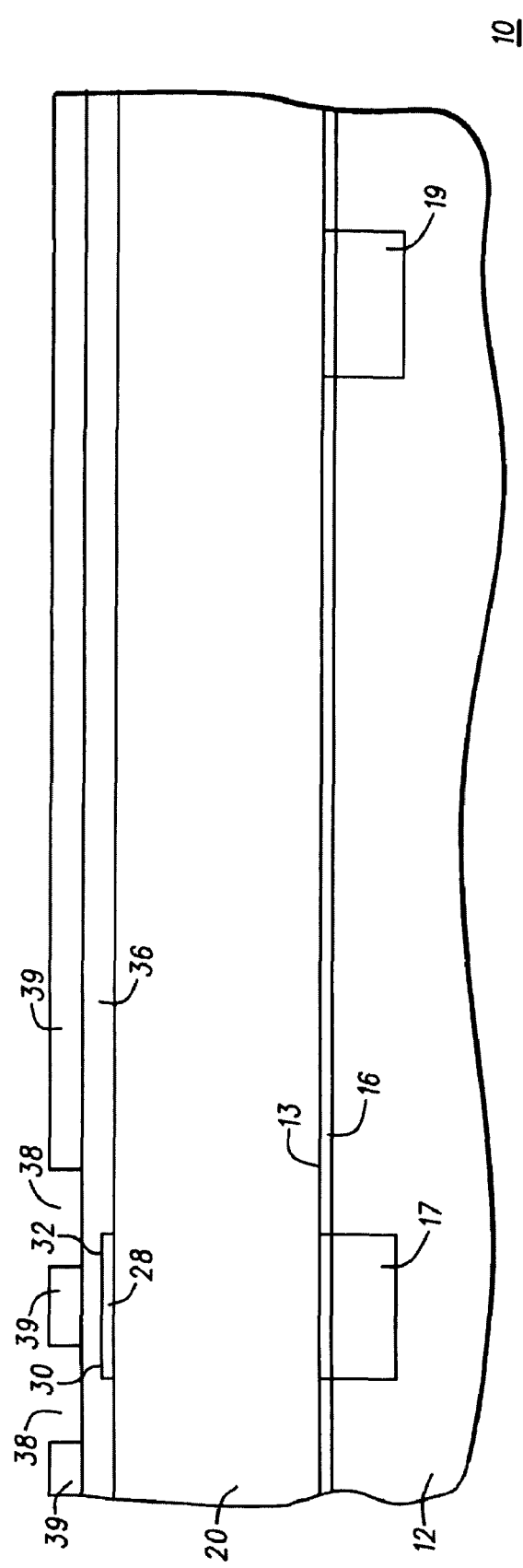
FIG. 3 is a cross-sectional view of the semiconductor component of FIG. 2 at a later stage of manufacture.

Referring now to FIG. 3, the exposed portions of electrically conductive layer 22 are anisotropically etched using, for example, a Reactive Ion Etch (RIE). The etch stops on dielectric layer 20. After the etch, a portion 28 of electrically conductive layer 22 remains on dielectric layer 20. Portion 28 has ends 30 and 32 and may serve as a resistor. Masking structure 26 is removed. A layer of dielectric material 36 having a thickness ranging from about 500 Å to about 10,000 Å is formed on dielectric layer 20 and on resistor 28. Dielectric layer 36 may be formed by chemical vapor deposition, PECVD, decomposition of tetraethylorthosilicate, as a spin-on dielectric material, or the like. By way of example, dielectric layer 36 is silicon dioxide that is formed by PECVD and has a thickness of about 6,000 Å. A layer of photoresist is formed on dielectric layer 36 and patterned to have openings 38 that expose portions of dielectric layer 36 that are over ends 30 and 32 and portions of dielectric layer 36 that are laterally adjacent to ends 30 and 32. The remaining portions of the photoresist layer serve as a masking structure 39.

Figure 4:
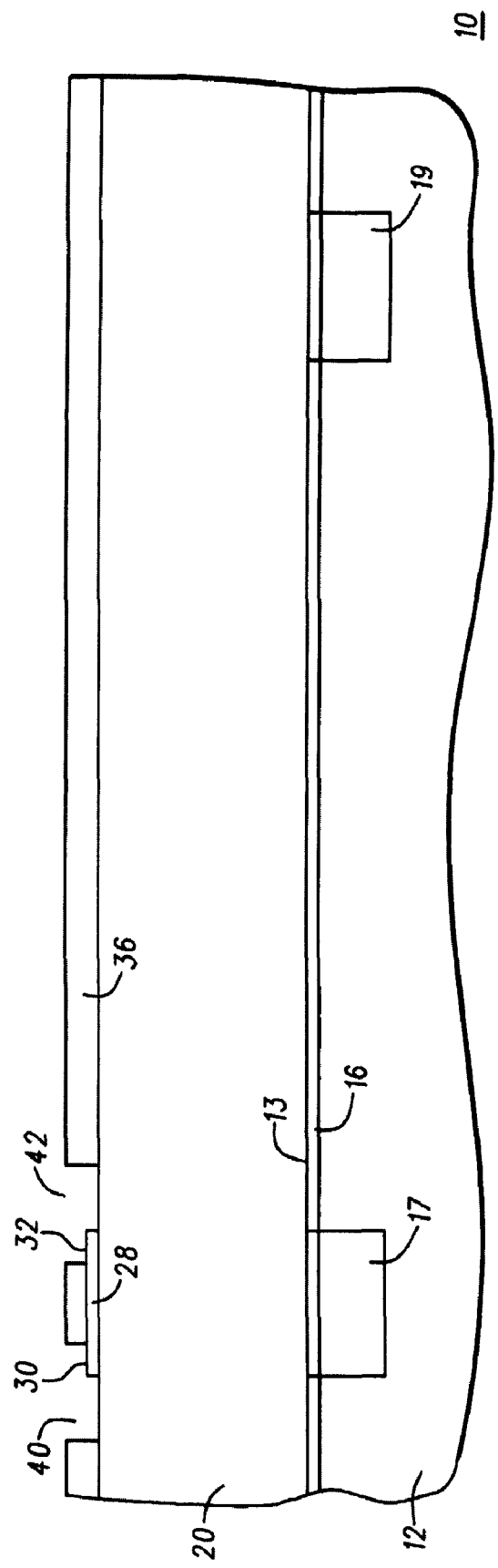
FIG. 4 is a cross-sectional view of the semiconductor component of FIG. 3 at a later stage of manufacture.

Referring now to FIG. 4, the exposed portions of dielectric layer 36 are anisotropically etched using, for example, a reactive ion etch to form openings or vias 40 and 42 that expose at least ends 30 and 32, respectively, of resistor 28 and portions of dielectric layer 20 adjacent to ends 30 and 32. Masking structure 39 is removed.

Figure 5:
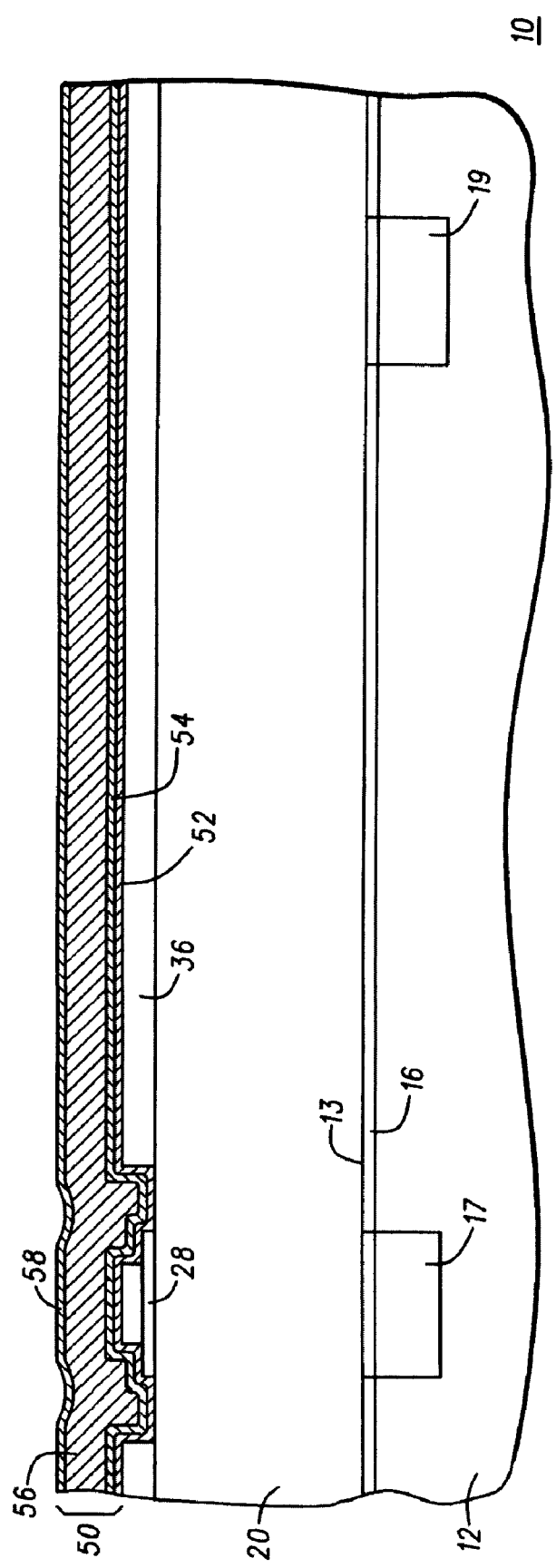
FIG. 5 is a cross-sectional view of the semiconductor component of FIG. 4 at a later stage of manufacture.

Referring now to FIG. 5, a metallization system 50 is formed on dielectric layer 36 and in openings 40 and 42. By way of the example, metallization system 50 comprises a layer of titanium 52 formed on dielectric layer 36 and the exposed portions of resistor 28, a layer of titanium nitride 54 formed on titanium layer 52, a layer of aluminum 56 formed on titanium nitride layer 54, and a layer of titanium nitride 58 formed on aluminum layer 56. In accordance with embodiments of the present invention, aluminum layer 56 is formed at a temperature ranging from about 150 degrees Celsius (° C.) to about 400° C. and to have a thickness that is at least ten times thicker than each of layers 52, 54, and 58.

Figure 6:
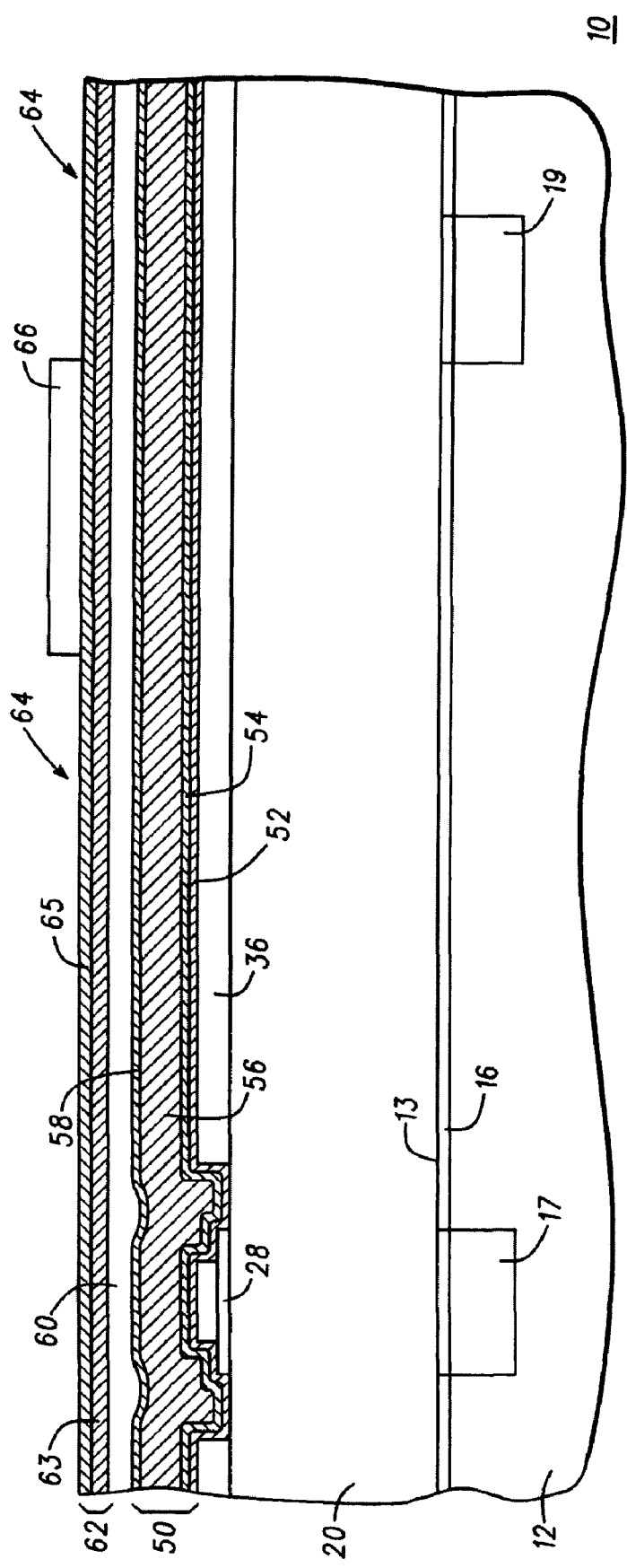
FIG. 6 is a cross-sectional view of the semiconductor component of FIG. 5 at a later stage of manufacture.

Referring now to FIG. 6, a layer of dielectric material 60 having a thickness ranging from about 200 Å to about 5,000 Å is formed on metallization system 50. By way of example, dielectric layer 60 is silicon nitride. Dielectric layer 60 may be formed using PECVD, chemical vapor deposition, or the like. A metallization system 62 is formed on dielectric layer 60. By way of example, metallization system 62 is comprised of aluminum layer 63 formed on dielectric layer 60 and a layer of titanium nitride 65 formed on aluminum layer 63. A layer of photoresist is formed on metallization system 62 and patterned to have openings 64 that expose portions of dielectric layer 60. The remaining portions of the photoresist layer serve as a masking structure 66.

Figure 7:
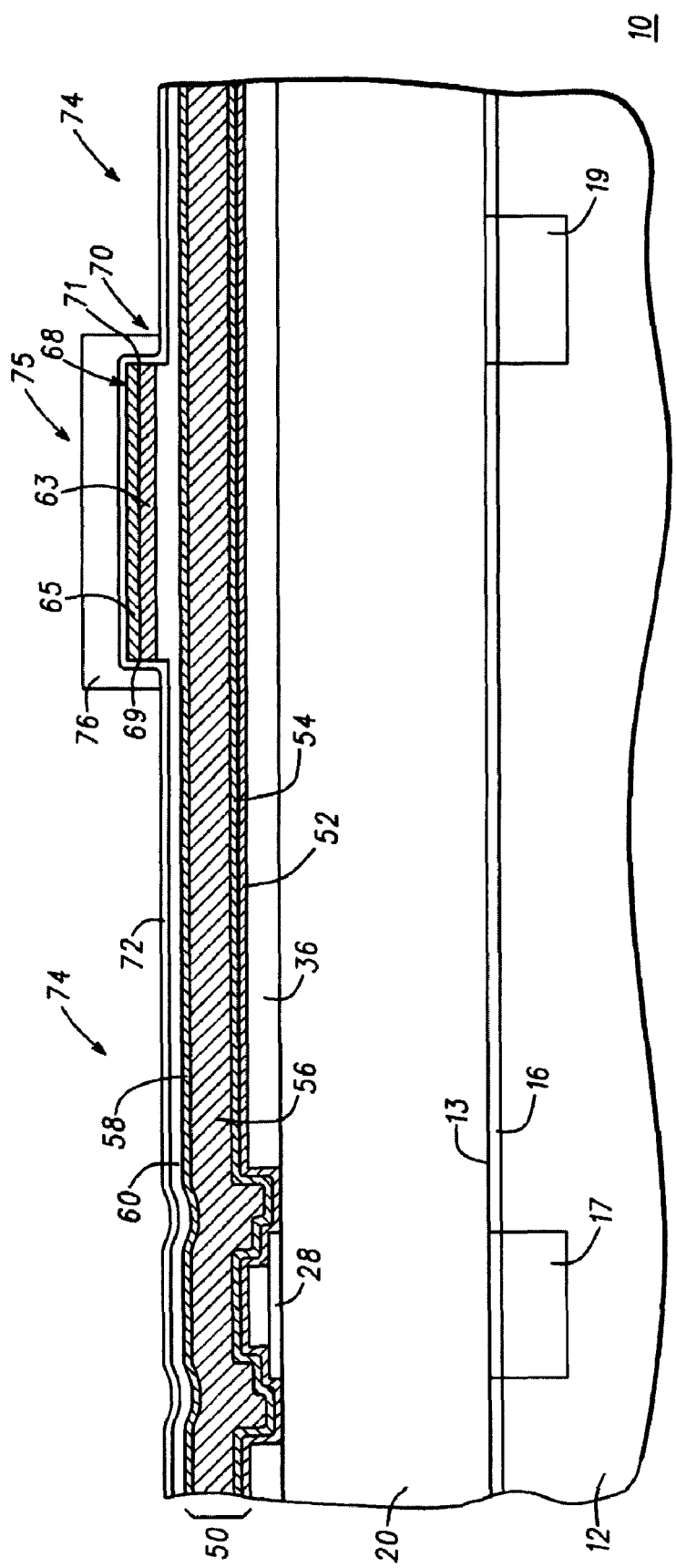
FIG. 7 is a cross-sectional view of the semiconductor component of FIG. 6 at a later stage of manufacture.

Referring now to FIG. 7, the exposed portions of metallization system 62 are anisotropically etched using, for example, a reactive ion etch. After etching through metallization system 62, the etch chemistry is changed to etch into dielectric layer 60. Preferably, the etch is stopped before etching through dielectric layer 60. After the etch is terminated, a portion 68 of metallization system 62 remains, where portion 68 has sidewalls 69 and 71 and is on a pedestal 70 that is formed from dielectric layer 60. Masking structure 64 is removed. It should be noted that portion 68 of metallization System 62, and the portions of dielectric layer 60 and metallization system 50 between dielectric layer 36 and portion 68 form a capacitor 75, wherein portion 68 serves as one plate of capacitor 75, metallization system 50 serves as another plate of capacitor 75 and the portion of dielectric layer 60 between the capacitor plates serve as the dielectric material of capacitor 75.

Still referring to FIG. 7, a layer of dielectric material 72 having a thickness ranging from about 100 Å to about 1,000 Å is formed on dielectric layer 60 and on portion 68 of metallization system 62. A layer of photoresist is formed on dielectric layer 72 and patterned to have openings 74 that expose portions of dielectric layer 72. The remaining portions of the photoresist layer serve as a masking structure 76. It should be noted that masking structure 76 extends beyond the portions of dielectric layer 72 formed on sidewalls 69 and 71 of capacitor plate 68 of metallization system 62. Thus, portions of dielectric layer 60 laterally adjacent to and spaced apart from the portions of dielectric layer 72 formed along sidewalls 69 and 71 are protected by masking structure 76.

Figure 8:
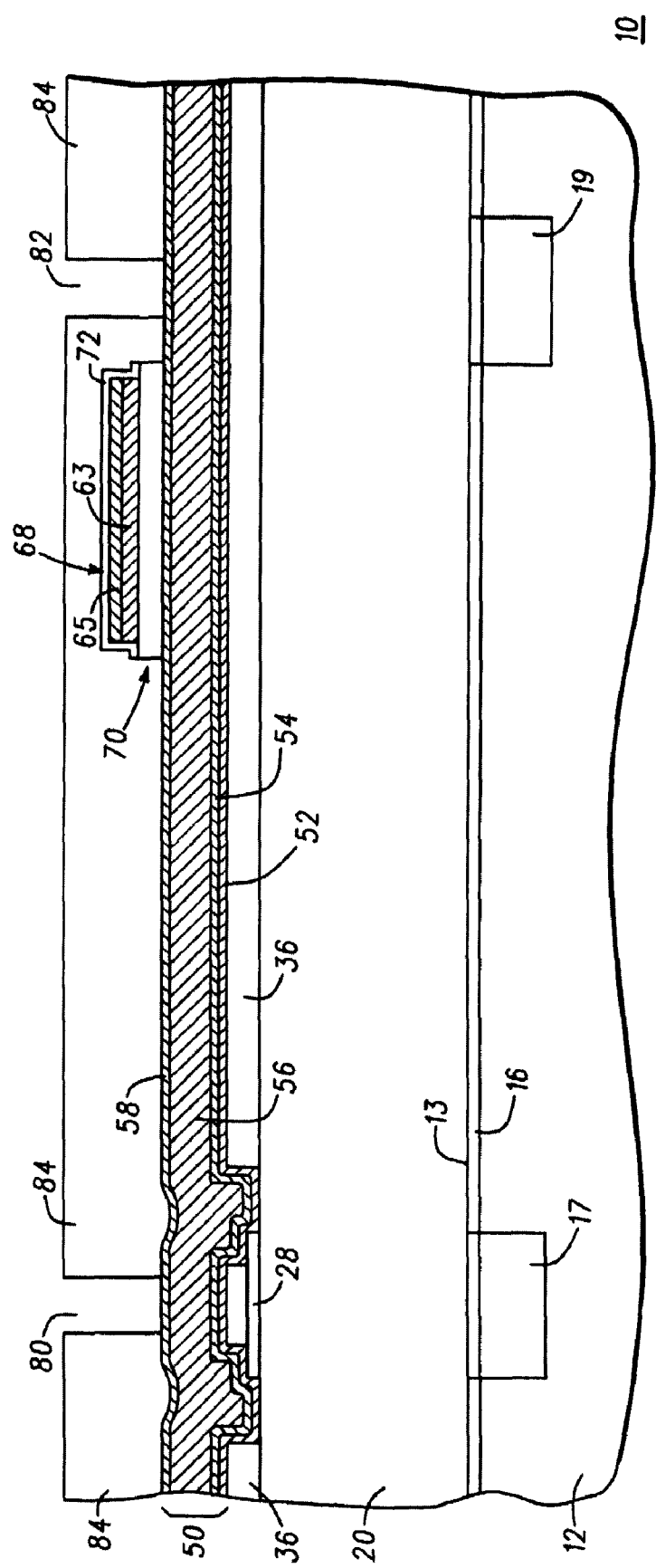
FIG. 8 is a cross-sectional view of the semiconductor component of FIG. 7 at a later stage of manufacture.

Referring now to FIG. 8, the exposed portions of dielectric layer 72 are anisotropically etched using, for example, a reactive ion etch. The etch extends through the unprotected portions of dielectric layer 72 and the unprotected portions of dielectric layer 60 and stops on metallization system 50. Masking structure 76 is removed. It should be noted that dielectric layer 72 protects the metal of capacitor plate 68 from damage caused by the etching process that stops on metallization system 50. After etching dielectric layers 72 and 60 and removal of masking structure 76, capacitor plate 68, the portion of dielectric layer 72 that is on the top and sidewalls of capacitor plate 68, the portion of dielectric layer 60 between capacitor plate 68 and metallization system 50, and the portions of dielectric layer 72 that are laterally adjacent to and spaced apart from the sidewalls of portion 68 remain. A layer of photoresist is formed on dielectric layer 72, the portions of dielectric layer 60 that are adjacent to portion 68, and on the exposed portions of metallization system 50 and patterned to have openings 80 and 82. The remaining portions of the photoresist layer serve as a masking structure 84.

Figure 9:
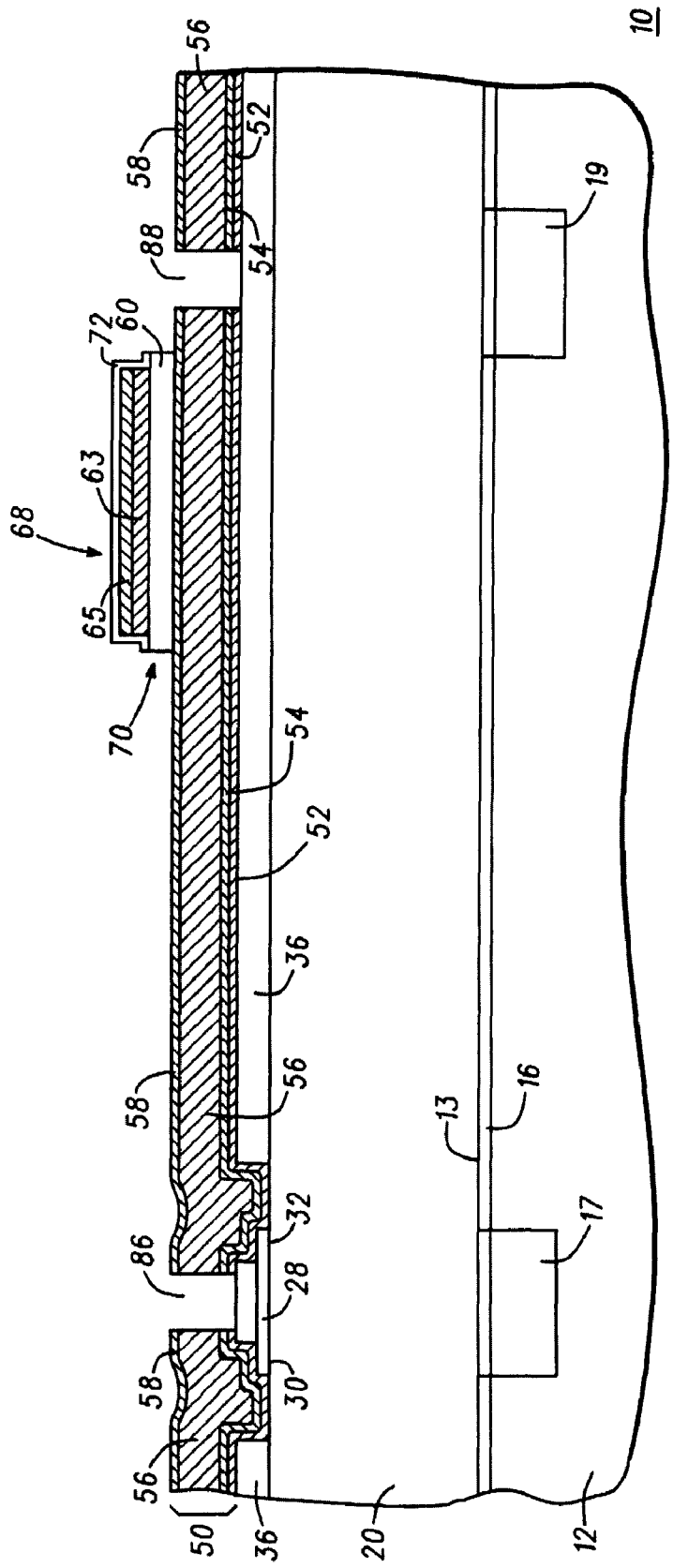
FIG. 9 is a cross-sectional view of the semiconductor component of FIG. 8 at a later stage of manufacture.

Referring now to FIG. 9, the portions of metallization system 50 exposed by openings 80 and 82 are anisotropically etched using, for example, a reactive ion etch to form openings 86 and 88 that extend through metallization system 50 and stop on dielectric layer 36. Masking structure 84 is removed.

Figure 10:
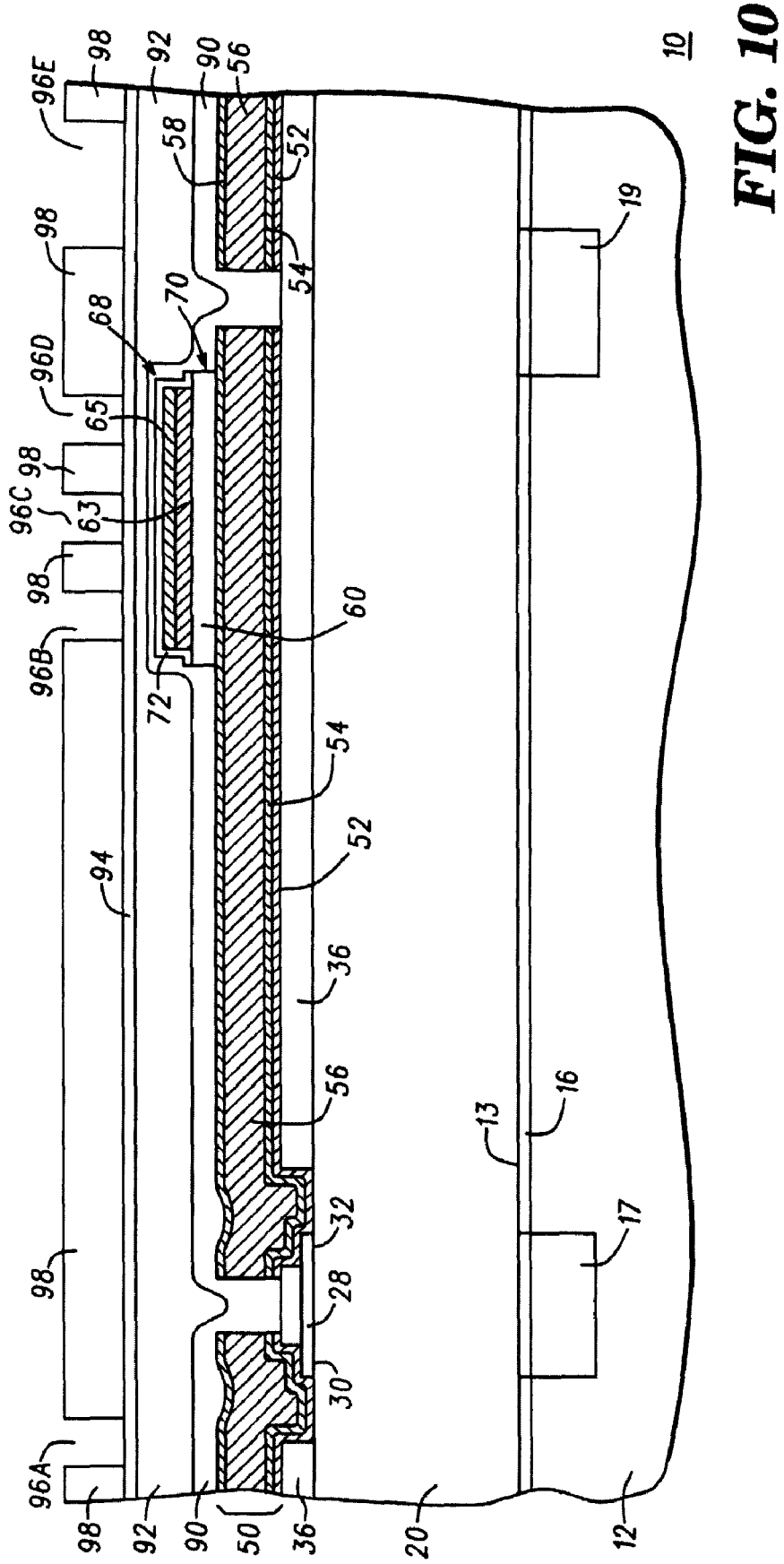
FIG. 10 is a cross-sectional view of the semiconductor component of FIG. 9 at a later stage of manufacture.

Referring now to FIG. 10, a layer of dielectric material 90 is formed on the exposed portions of metallization system 50 and in openings 86 and 88 and a layer of dielectric material 92 is formed on dielectric layer 90. By way of example, dielectric layer 90 comprises silicon dioxide that may be formed using a High Density Vapor Plasma Chemical Vapor Deposition (HDPCVD) process and dielectric layer 92 may be comprised of silicon dioxide formed using plasma enhanced chemical vapor deposition. Dielectric layer 92 is planarized using, for example, a chemical mechanical planarization technique. After planarization, a layer of dielectric layer 94 is formed on dielectric layer 92. By way of example, dielectric layer 94 is silicon nitride formed using plasma enhanced chemical vapor deposition. A layer of photoresist is formed on dielectric layer 94 and patterned to have openings 96A, 96B, 96C, 96D, and 96E. The remaining portions of the photoresist layer serve as a masking structure 98.

Figure 11:
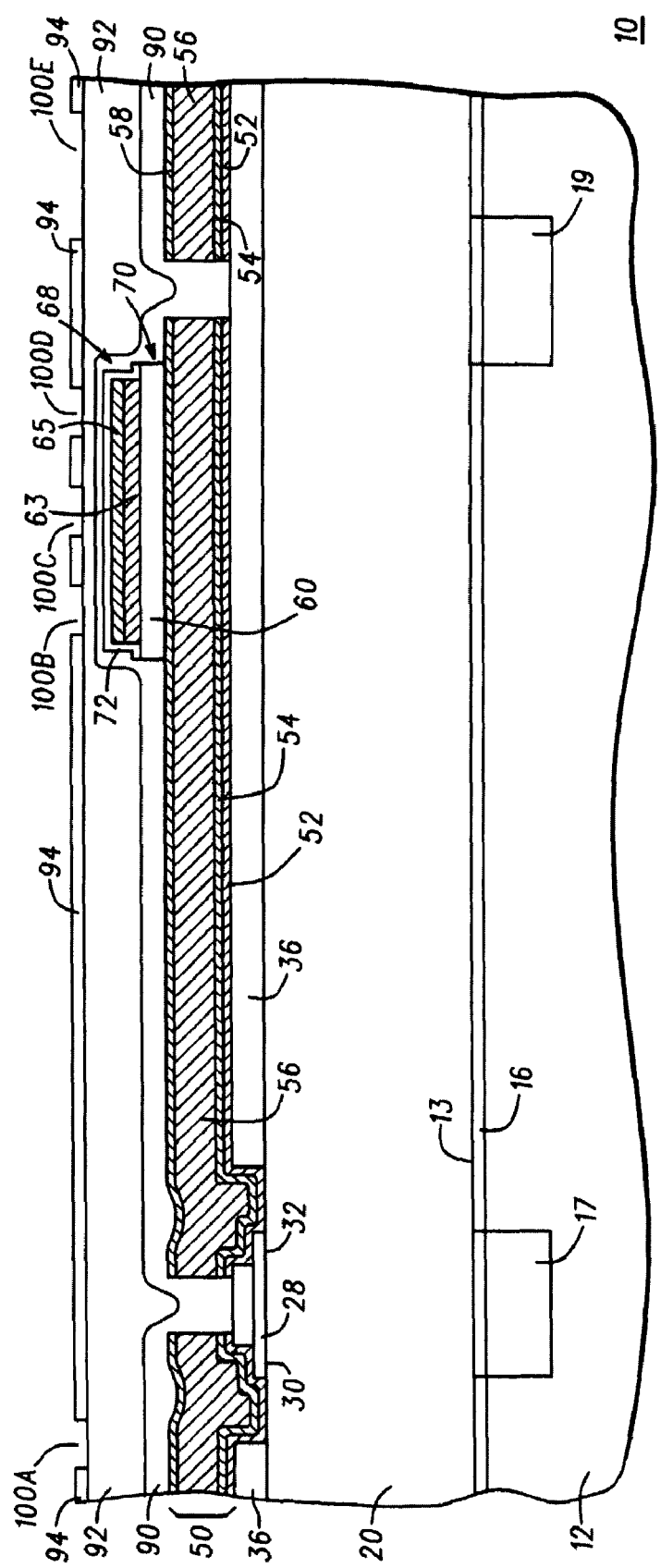
FIG. 11 is a cross-sectional view of the semiconductor component of FIG. 10 at a later stage of manufacture.

Referring now to FIG. 11, the portions of dielectric layer 94 exposed by openings 96A-96E are removed using, for example, a reactive ion etch to form openings 100A, 100B, 100C, 100D, and 100E in dielectric layer 94. Openings 100A-100E expose portions of dielectric layer 92. Masking structure 98 is removed.

Figure 12:
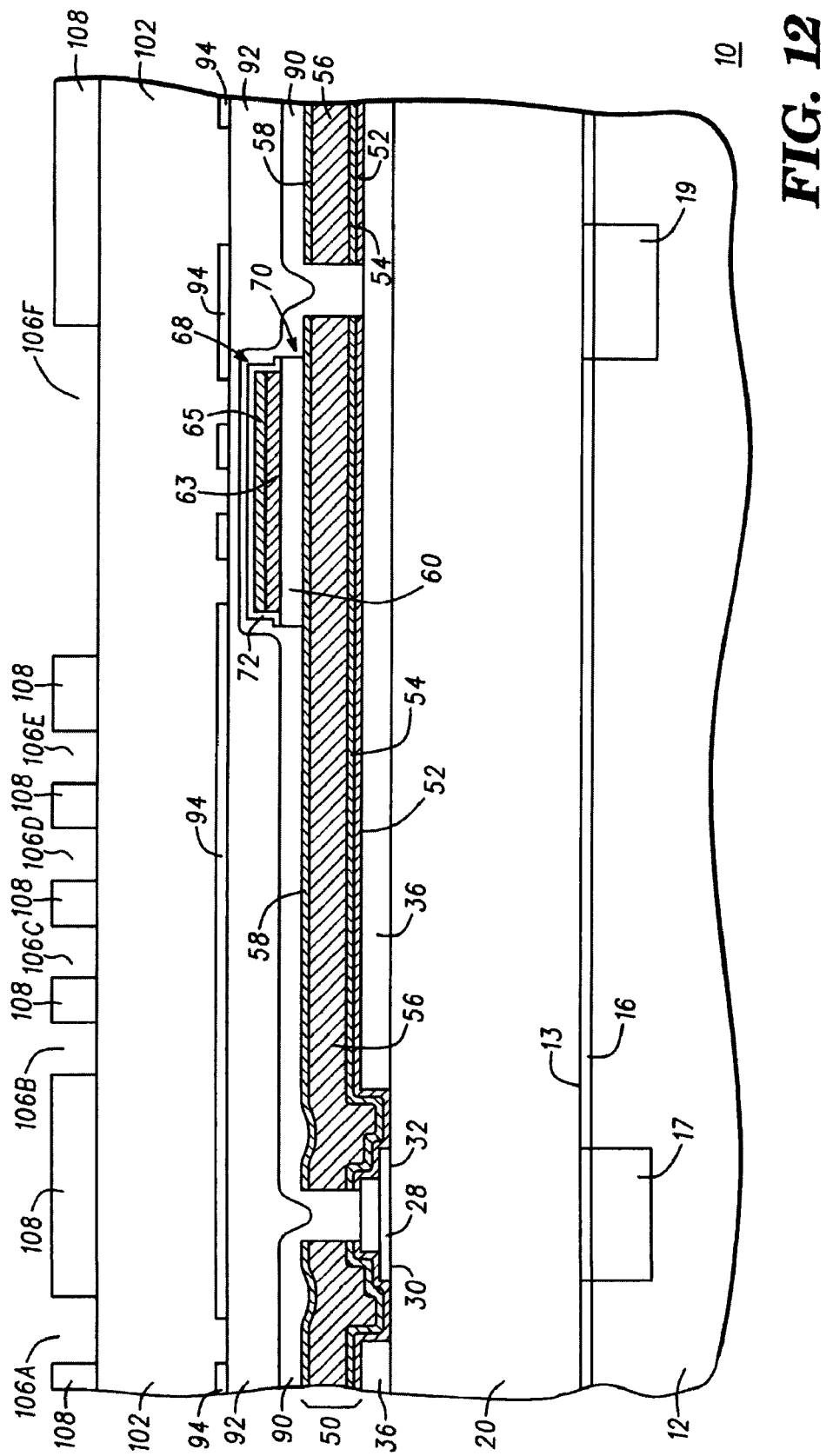
FIG. 12 is a cross-sectional view of the semiconductor component of FIG. 11 at a later stage of manufacture.

Referring now to FIG. 12, a layer of dielectric material 102 is formed on dielectric layer 94 and in openings 100A-100E. A layer of photoresist is formed on dielectric layer 102 and patterned to have openings 106A, 106B, 106C, 106D, 106E, and 106F. The remaining portions of the photoresist layer serve as a masking structure 108.

Figure 13:
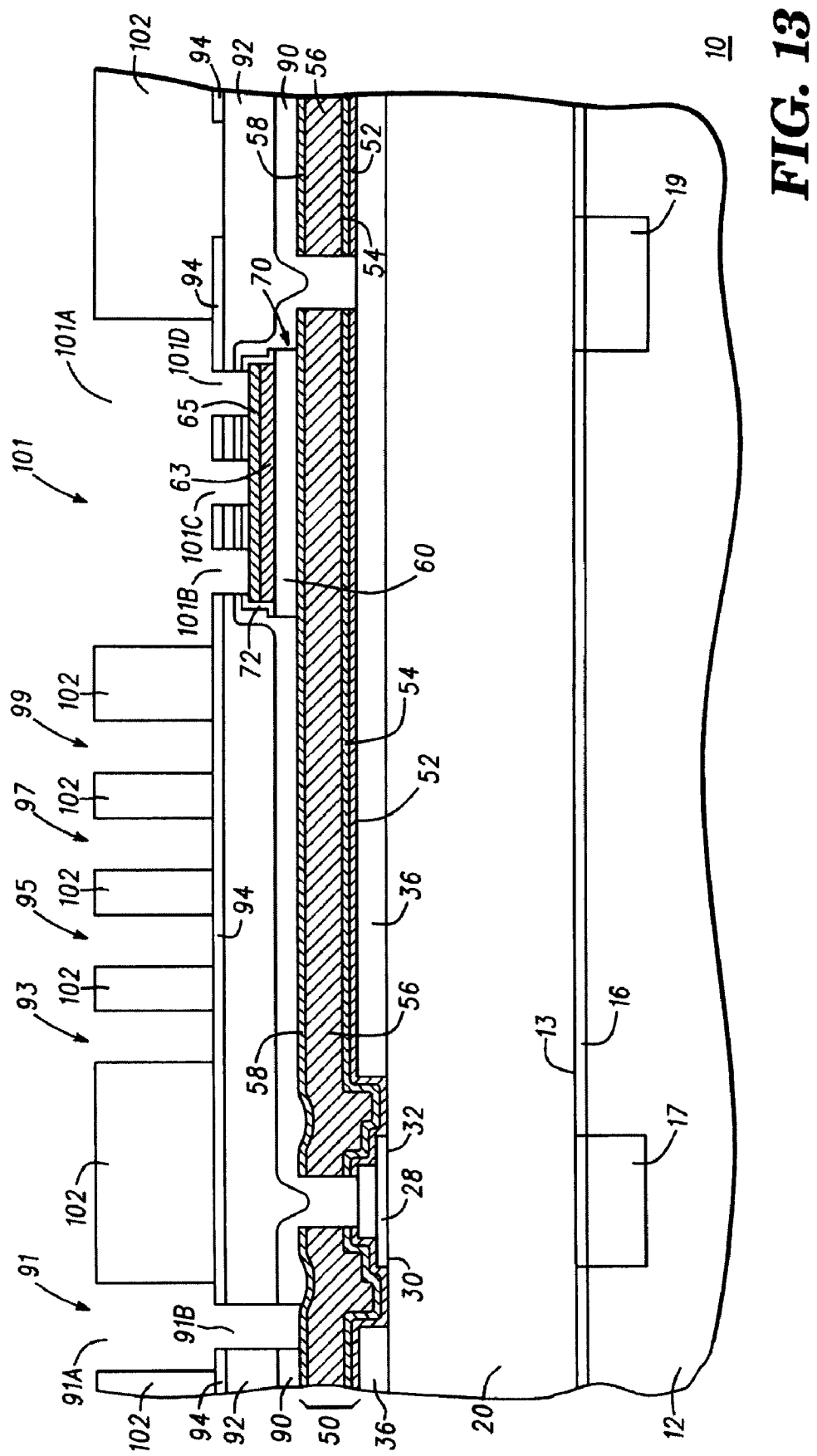
FIG. 13 is a cross-sectional view of the semiconductor component of FIG. 12 at a later stage of manufacture.

Referring now to FIG. 13, the portions of dielectric layer 102 exposed by openings 106A-106F are anisotropically etched using, for example, a reactive ion etch. Dielectric layer 94 serves as an etch stop layer. Thus, dielectric layer 94 protects portions of dielectric layer 92 from the etchant. However, the portions of dielectric layer 92 unprotected by dielectric layer 94 are removed using the anisotropic etch. Anisotropically etching the portions of dielectric layer 92 re-opens openings 100A-106D (shown in FIG. 11) after which the portions of dielectric layers 92 and 90 that are unprotected by dielectric layer 94 are etched. Metallization systems 50 and 62 serve as etch stops. It should be noted that etching dielectric layers 102, 94, 92, and 90 forms openings or vias 91, 93, 95, 97, 99, and 101, where opening 91 has portions 91A and 91B and opening 101 has portions 101A, 101B, 101C, and 101D. Regarding opening 91, portion 91A is formed in dielectric layer 102 and portion 91B is formed in dielectric layers 94, 92, and 90. Regarding opening 101, portion 101A is formed in dielectric layer 102 and portions 101B, 101C, and 101D are formed in dielectric layers 94, 92, and 90. Masking structure 108 is removed.

Figure 14:
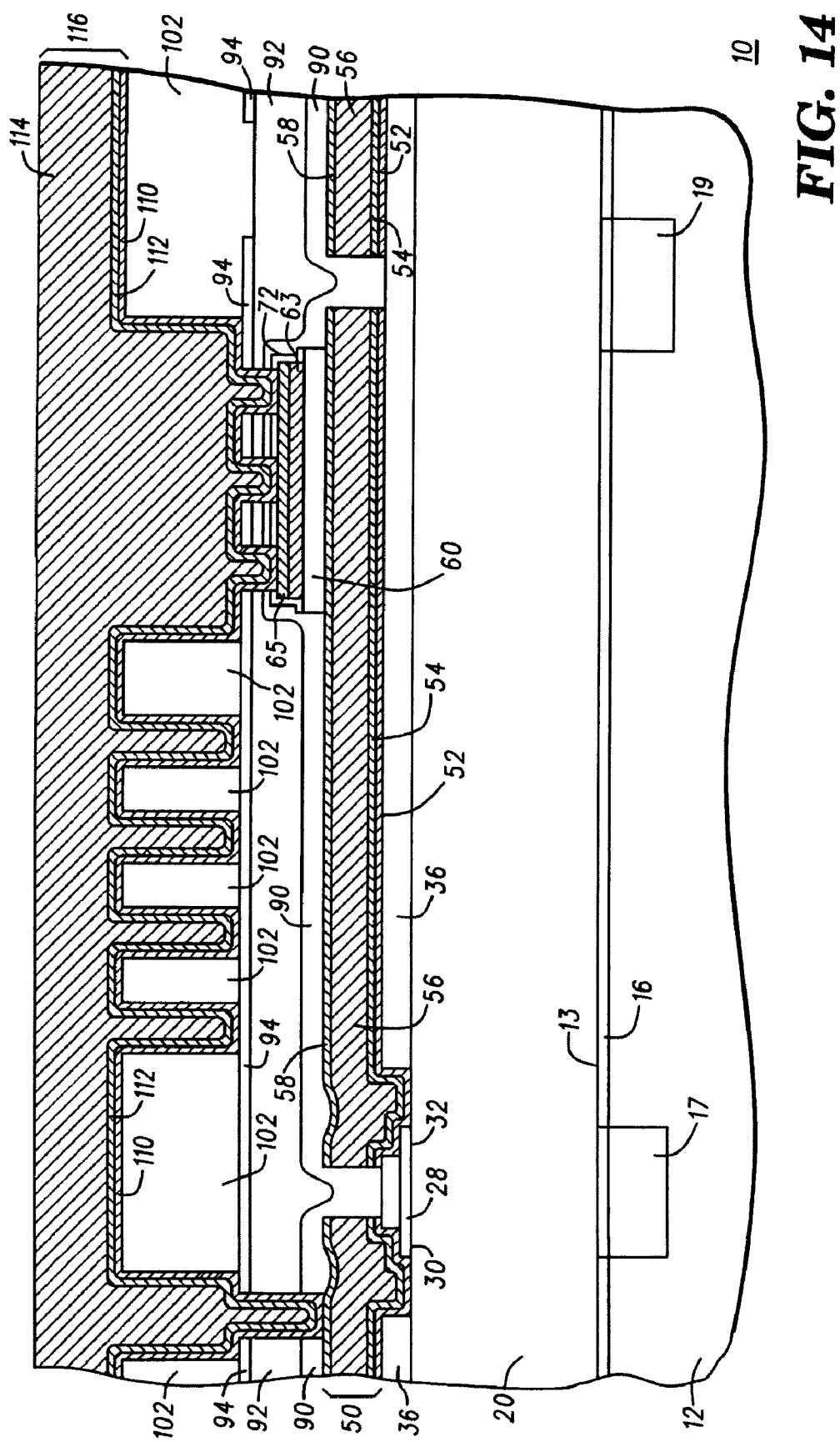
FIG. 14 is a cross-sectional view of the semiconductor component of FIG. 13 at a later stage of manufacture.

Referring now to FIG. 14, a layer of a refractory metal 110 such as, for example, tantalum is formed on dielectric layer 92 and in openings 106A-106F, a layer of copper 112 is formed on tantalum layer 110, and a layer of copper 114 is formed on copper layer 112. Layers 110, 112, and 114 form a metallization system 116.

Figure 15:
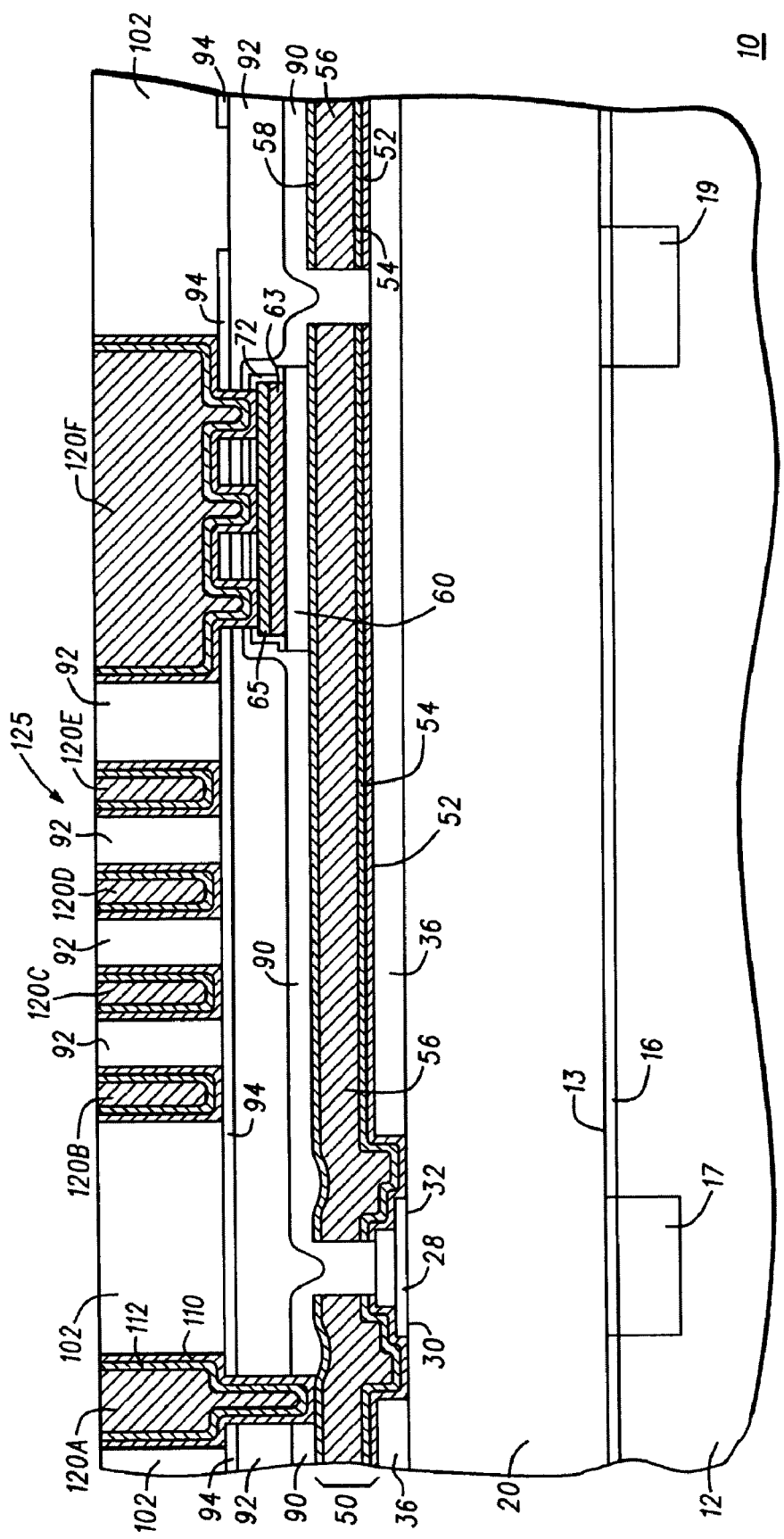
FIG. 15 is a cross-sectional view of the semiconductor component of FIG. 14 at a later stage of manufacture.

Referring now to FIG. 15, metallization system 116 is planarized using, for example, a chemical mechanical planarization technique and an etch chemistry suitable for etching copper. Planarizing metallization system 116 leaves conductors 120A, 120B, 120C, 120D, 120E, and 120F in openings 91, 93, 95, 97, 99, and 101, respectively. It should be noted that conductors 120A-120F are formed using a damascene process and that conductors 120A-120F and dielectric layers 102, 94, 92 and 90 are referred to as damascene structures. It should be further noted that conductors 120A-120F may form a portion of an inductor 125. For example, conductors 120A-120F form subportions of inductor segments such as segments 628-632 shown in FIG. 44 or segments 651-657 shown in FIG. 45.

The semiconductor wafer that includes semiconductor material 12, dielectric layers 90, 92, 94, and 102, and conductors 120A-120F is heated in a reducing ambient at a temperature of about 400° C. for time ranging from about 10 minutes to about 90 minutes.

Figure 16:
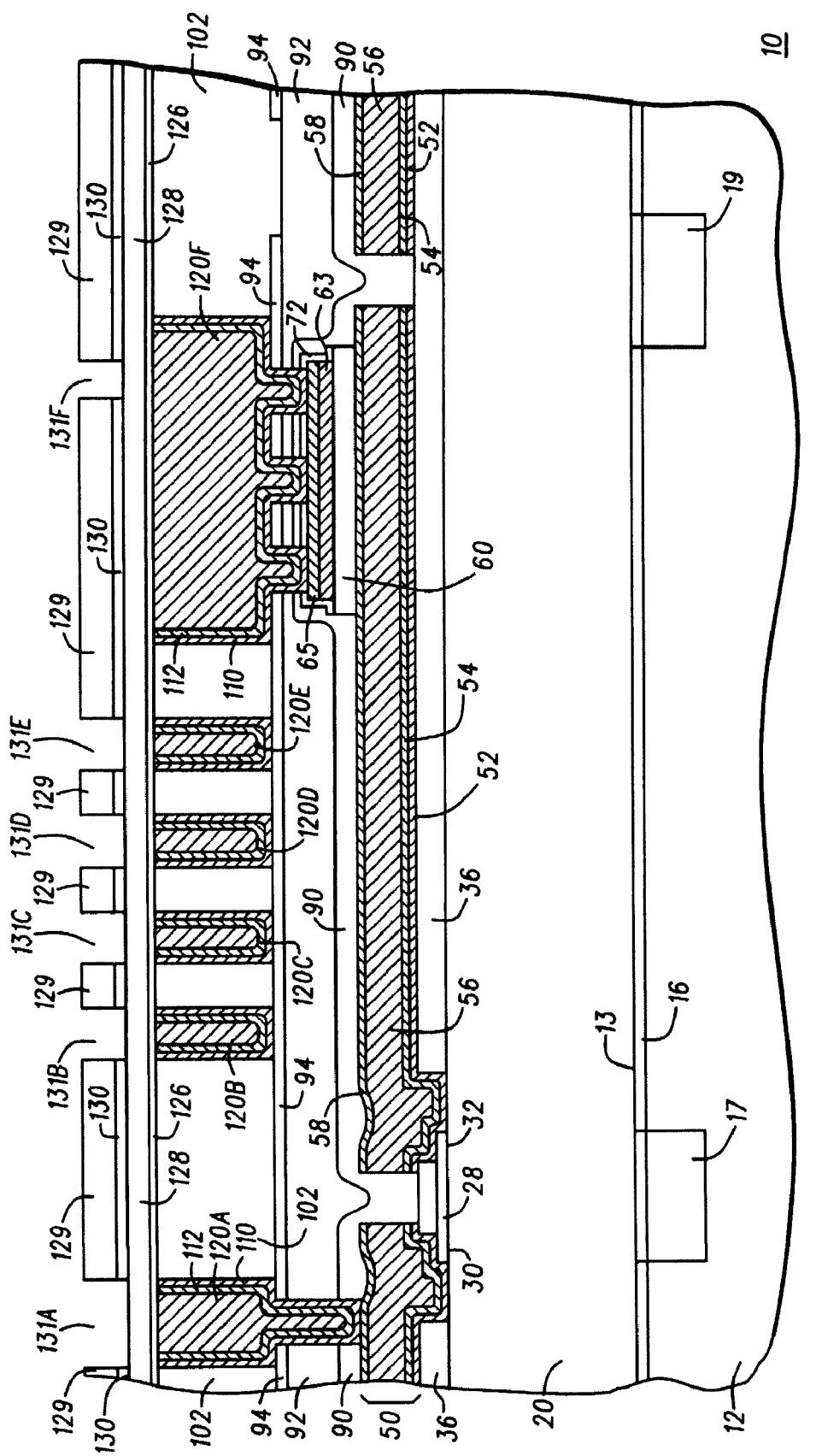
FIG. 16 is a cross-sectional view of the semiconductor component of FIG. 15 at a later stage of manufacture.

Referring now to FIG. 16, a layer of dielectric material 126 having a thickness ranging from about 100 Å to about 1,000 Å is formed on dielectric layer 102 and conductors 120A-120F and a layer of dielectric material 128 having a thickness ranging from about 7,000 Å to about 60,000 Å is formed on dielectric layer 126. By way of example, before dielectric layer 126 is formed, dielectric layer 102 and conductors 120A-120F are treated with an ammonia ($NH_3$) plasma for a time ranging from about 10 seconds to about 200 seconds followed by the formation of a layer of dielectric material 126 on dielectric layer 102 and conductors 120A-120F. Dielectric layer 126 may be silicon nitride that is formed using, for example, a plasma enhanced chemical vapor deposition technique and dielectric layer 128 may be silicon dioxide formed using a plasma enhanced chemical vapor deposition technique. A layer of dielectric material 130 is formed on dielectric layer 128. The material of dielectric layer 130 may be silicon nitride formed using a plasma enhanced chemical vapor deposition technique. A layer of photoresist is formed on dielectric layer 130 and patterned to have openings that expose portions of dielectric layer 130. The remaining portions of the photoresist layer serve as a masking structure 129. The exposed portions of dielectric layer 130 are anisotropically etched using, for example, a reactive ion etch to form openings 131A, 131B, 131C, 131D, 131E, and 131F in dielectric layer 130, which openings 131A-131F expose portions of dielectric layer 128.

Figure 17:
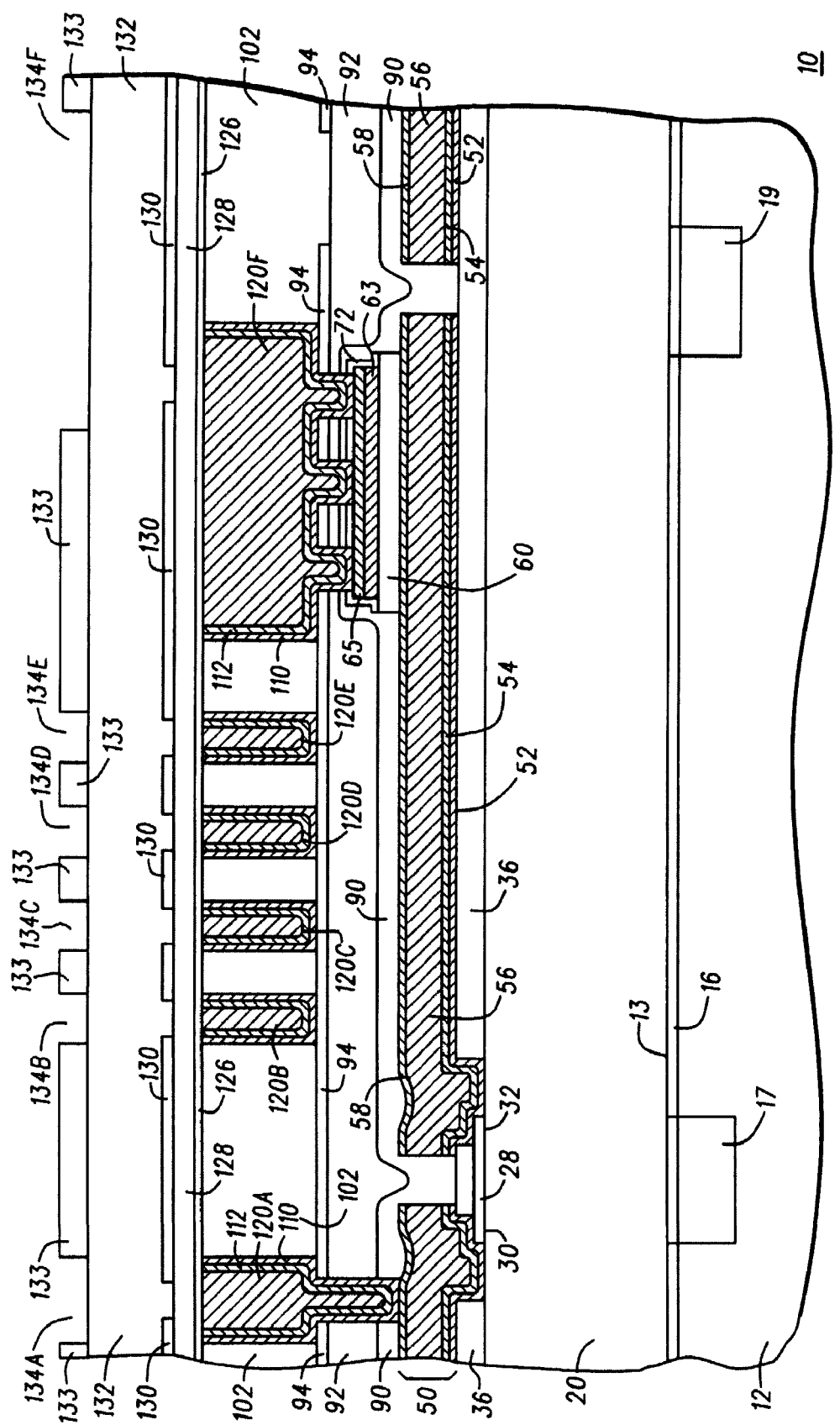
FIG. 17 is a cross-sectional view of the semiconductor component of FIG. 16 at a later stage of manufacture.

Referring now to FIG. 17, a layer of dielectric material 132 is formed on dielectric layer 130. By way of example, dielectric layer 132 is silicon dioxide formed using plasma enhanced chemical vapor deposition and has a thickness ranging from about 45,000 Å to about 100,000 Å. It should be noted that the type of dielectric material and the method of forming the dielectric material are not limited to silicon dioxide formed using plasma enhanced chemical vapor deposition. Other suitable dielectric materials include low-dielectric constant (low-κ) dielectrics such as, for example, the low-κ dielectric material sold under the trademark BLACK DIAMOND or the low-κ dielectric material sold under the trademark CORAL. Other techniques of forming the dielectric material include decomposition of TEOS, application of a spin-on dielectric, or the like. A layer of photoresist is formed on dielectric layer 132 and patterned to have openings 134A, 134B, 134C, 134D, 134E, and 134F. The remaining portions of the photoresist layer serve as a masking structure 133.

Figure 18:
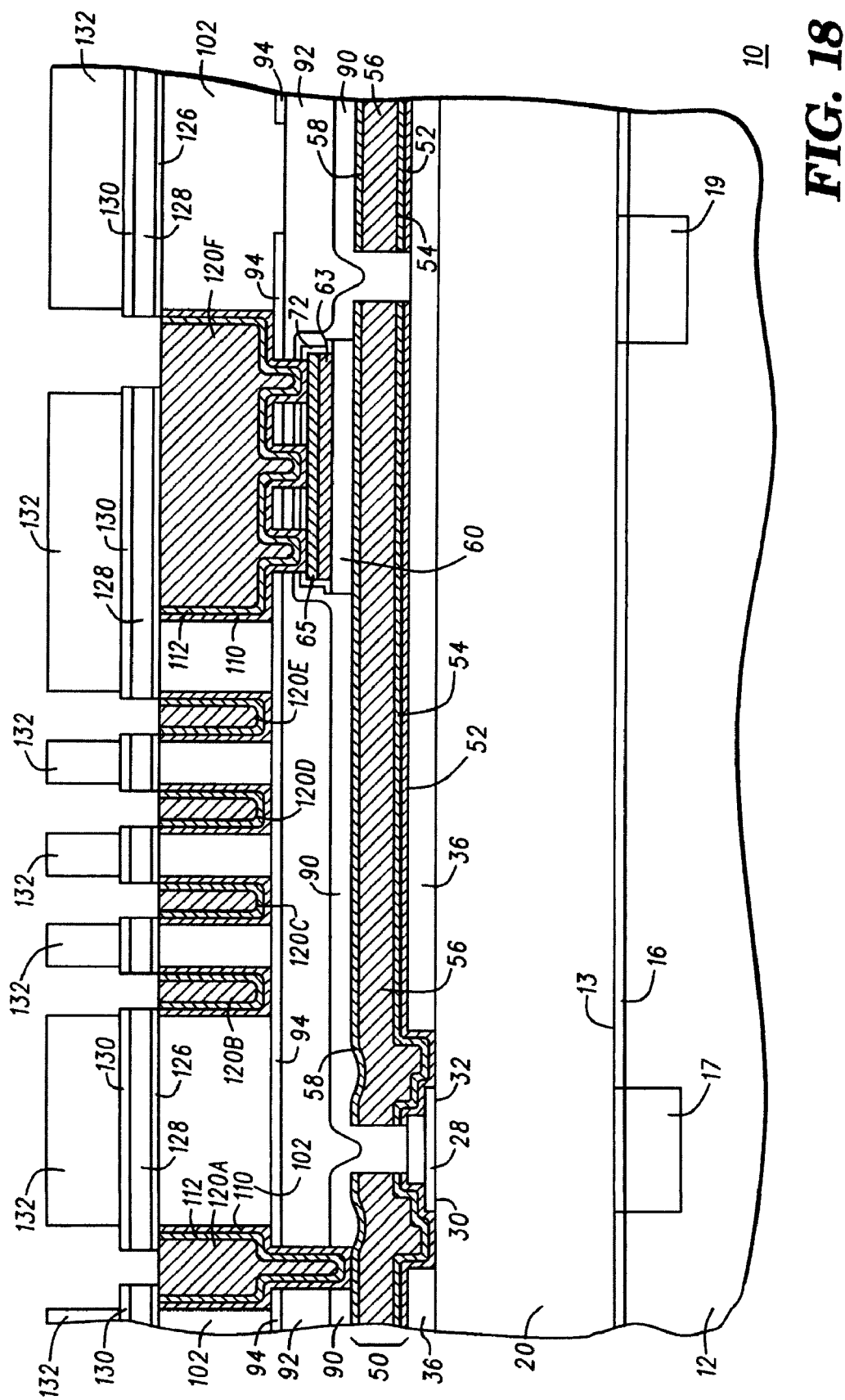
FIG. 18 is a cross-sectional view of the semiconductor component of FIG. 17 at a later stage of manufacture.

Referring now to FIG. 18, the portions of dielectric layer 132 exposed by openings 134A-134F are anisotropically etched using, for example, a reactive ion etch. Dielectric layer 130 serves as an etch stop layer. Thus, dielectric layer 130 protects portions of dielectric layer 128 from the etchant. However, the portions of dielectric layer 128 unprotected by dielectric layer 130 are removed using the anisotropic etch. Like dielectric layer 130, conductors 120A-120F serve as an etch stop. Anisotropically etching the portions of dielectric layer 132 re-opens openings 131A-131F.

Figure 19:
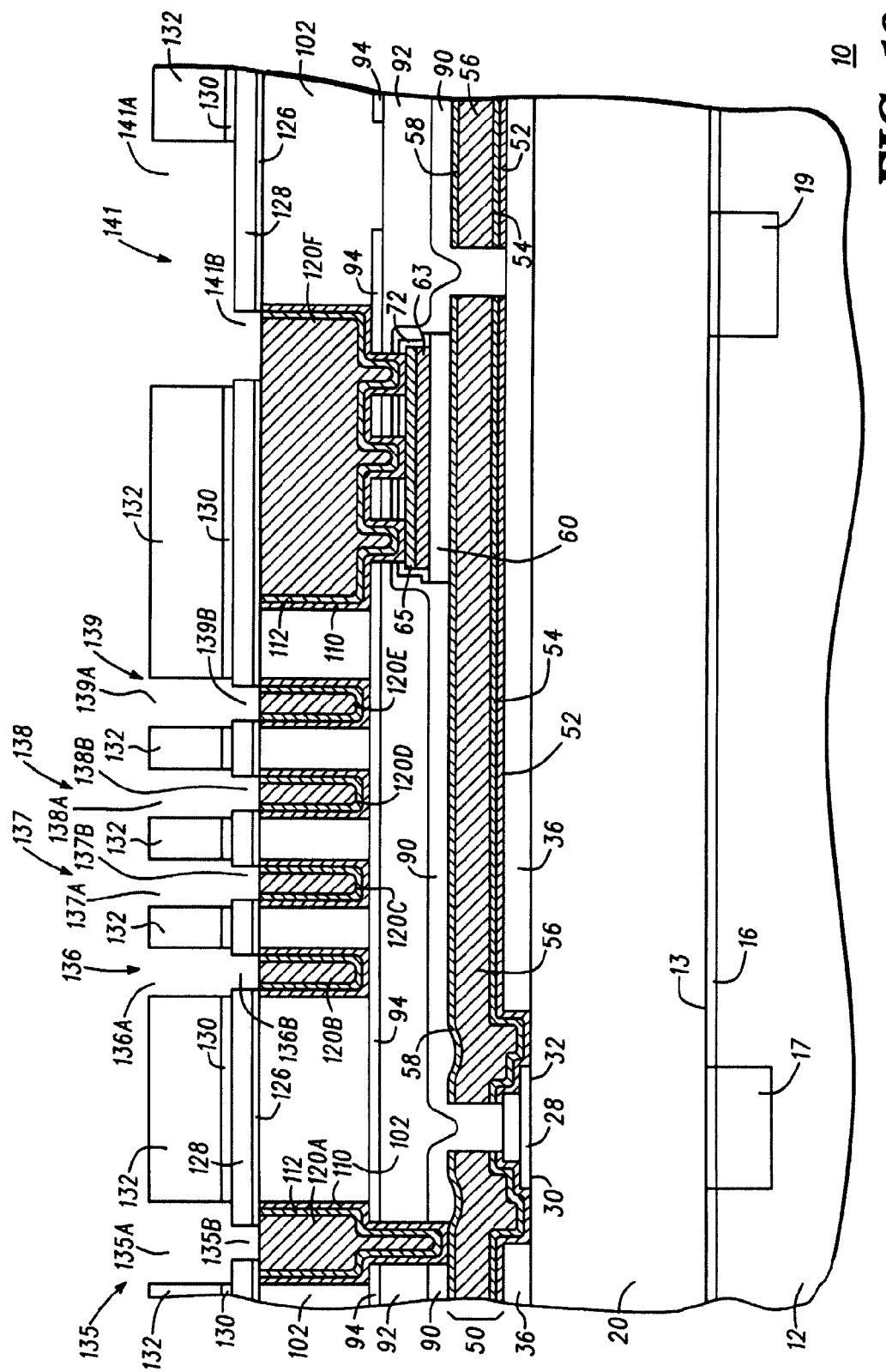
FIG. 19 is a cross-sectional view of the semiconductor component of FIG. 18 at a later stage of manufacture.

Referring now to FIG. 19, the portions of dielectric layer 130 that serve as an etch stop during the etching of dielectric layer 132 and the portion of dielectric layer 126 exposed by the etch process described with reference to FIG. 18 are removed using, for example, an anisotropic etch. It should be noted that etching dielectric layers 132, 130, and 128 forms openings or vias 135, 136, 137, 138, 139, and 141, where opening 135 has portions 135A and 135B, opening 136 has portions 136A and 136B, opening 137 has portions 137A and 137B, opening 138 has portions 138A and 138B, opening 139 has portions 139A and 139B, and opening 141 has portions 141A and 141B.

Figure 20:
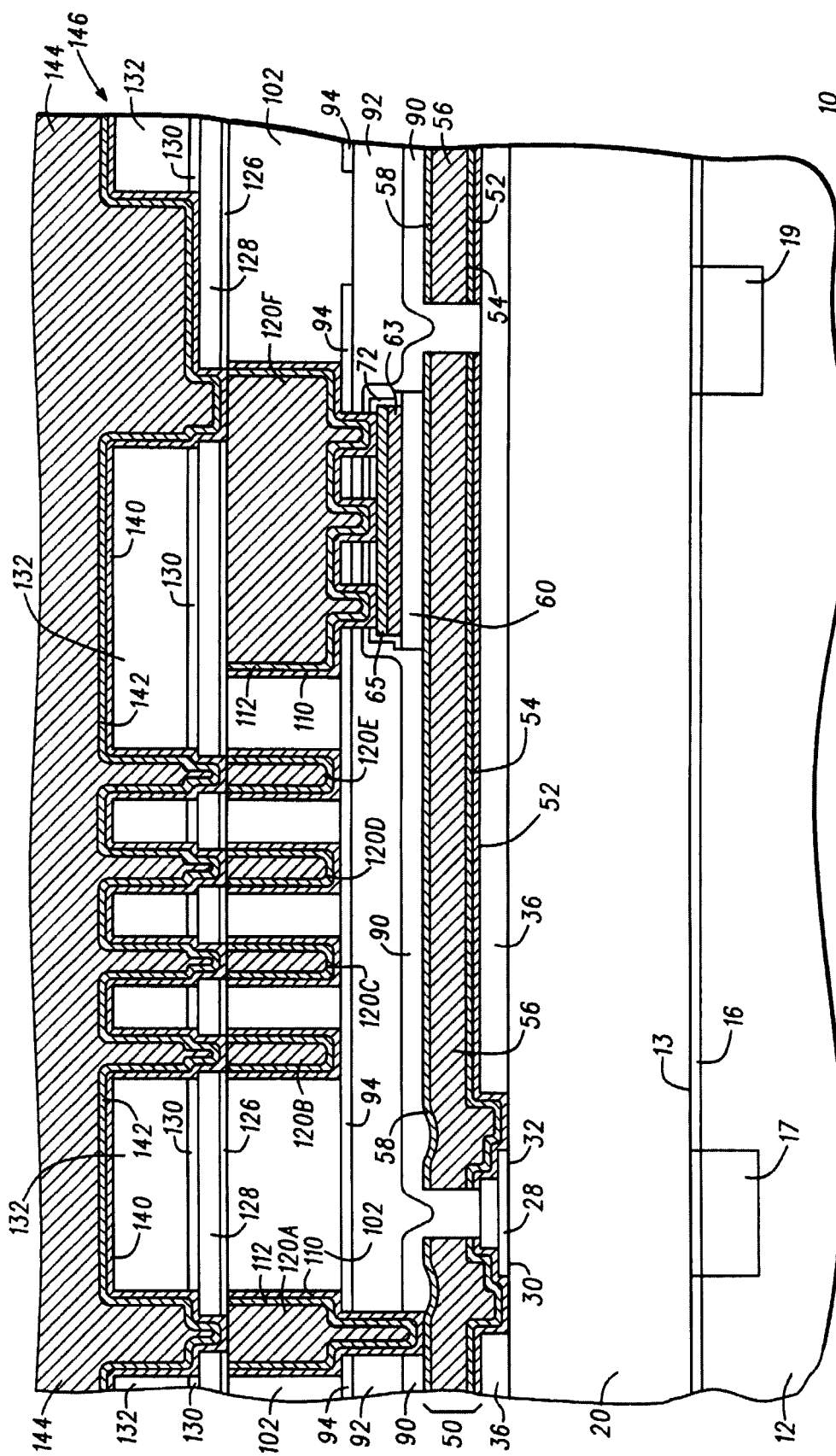
FIG. 20 is a cross-sectional view of the semiconductor component of FIG. 19 at a later stage of manufacture.

Referring now to FIG. 20, a layer of a refractory metal 140 such as, for example, tantalum is formed on dielectric layer 132 and in openings 135, 136, 137, 138, 139, and 141; a layer of copper 142 is formed on tantalum layer 140; and a layer of copper 144 is formed on copper layer 142. Layers 140, 142, and 144 form a metallization system 146.

Figure 21:
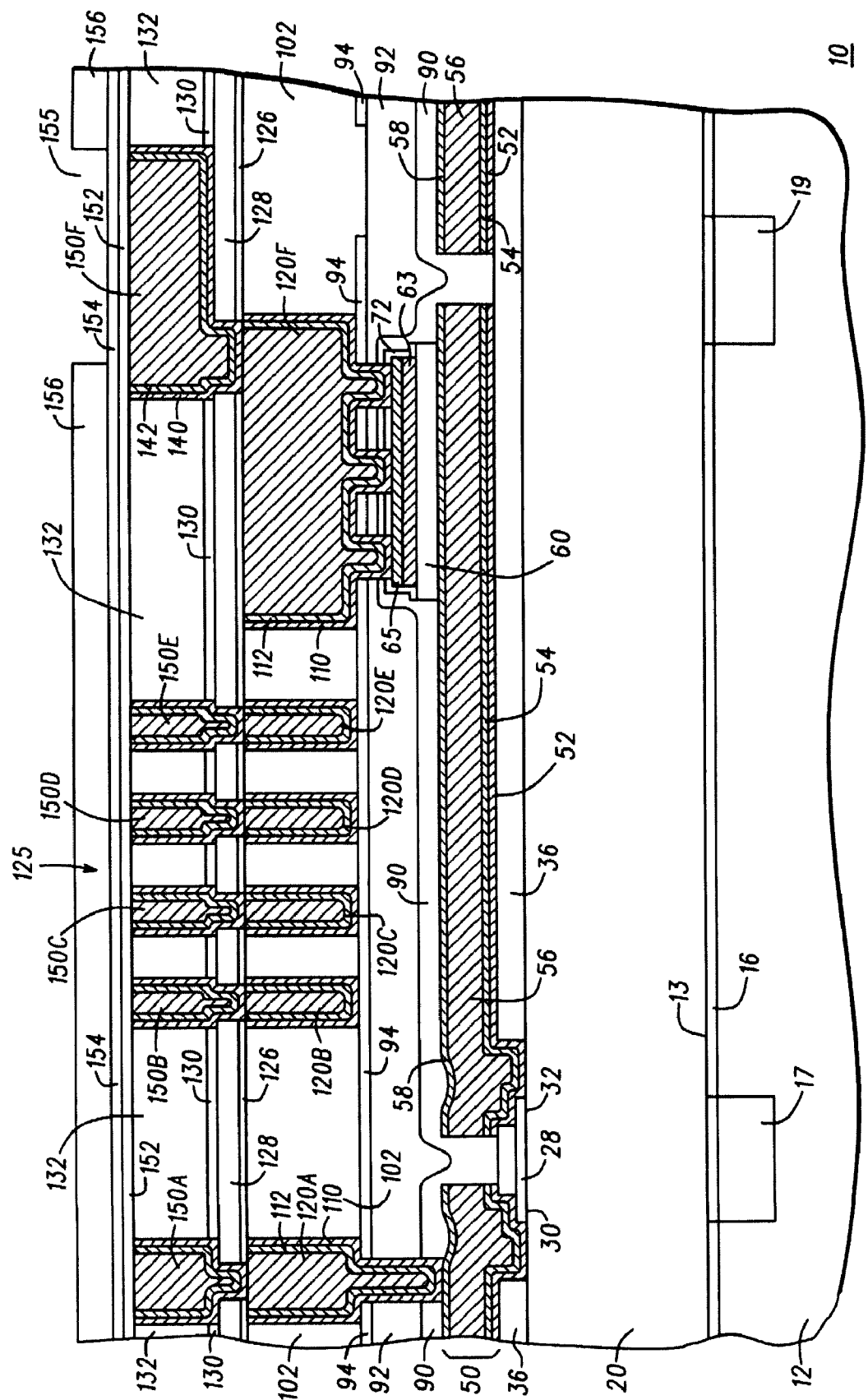
FIG. 21 is a cross-sectional view of the semiconductor component of FIG. 20 at a later stage of manufacture.

Referring now to FIG. 21, metallization system 146 is planarized using, for example, a chemical mechanical planarization technique and an etch chemistry suitable for etching copper. Planarizing metallization system 146 leaves conductors 150A, 150B, 150C, 150D, 150E, and 150F in openings 135, 136, 137, 138, 139, and 141, respectively. It should be noted that conductors 150A-150F are formed using a damascene process and that conductors 150A-150F and dielectric layers 132, 130, and 128 are referred to as damascene structures. It should be further noted that conductors 150A-150F may form a portion of an inductor 125, where conductors 120A and 150A cooperate to form a terminal or conductor of inductor 125, conductors 120B and 150B cooperate to form a portion of a winding or segment of inductor 125, conductors 120C and 150C cooperate to form a portion of another winding or segment of inductor 125, conductors 120D and 150D cooperate to form a portion of another winding or segment of inductor 125, conductors 120E and 150E cooperate to form a portion of another winding or segment of inductor 125, and portions 120F and 150F cooperate to form a portion of a terminal or conductor of inductor 125. Portions 120A and 150A may be referred to as conductor elements, portions 120E and 150F may be referred to as conductor elements, the combination of portions 120A and 150A cooperate to form a conductor and portions 120F and 150F cooperate to form a conductor. Conductors 120B and 150B may form a portion of an inductor segment such as, for example, segments 628-632 shown in FIG. 44 or segments 651-657 shown in FIG. 45. Likewise, conductors 120C and 150C, 120D and 150D, and 120E and 150E may cooperate to form inductor segments that correspond to, for example, segments 628-632 shown in FIG. 44 or segments 651-657 shown in FIG. 45.

A layer of dielectric material 152 having a thickness ranging from about 100 Å to about 1,000 Å is formed on dielectric layer 132 and conductors 150A-150F. In accordance with embodiments of the present invention, before forming dielectric layer 152, dielectric layer 132 and conductors 150A-150F are treated with an ammonia ($NH_3$) plasma for a time ranging from about 10 seconds to about 200 seconds followed by the formation of a layer of dielectric material 153 on dielectric layer 152. By way of example, dielectric layer 152 is silicon nitride that is formed using, for example, a plasma enhanced chemical vapor deposition technique and dielectric layer 153 is silicon dioxide formed using a plasma enhanced chemical vapor deposition technique. An optional layer of dielectric material 154 is formed on dielectric layer 153. The material of dielectric layer 154 may be silicon nitride formed using a plasma enhanced chemical vapor deposition technique. A layer of photoresist is formed on dielectric layer 152 and patterned to have an opening 155. The remaining portions of the photoresist layer serve as a masking structure 156.

Figure 22:
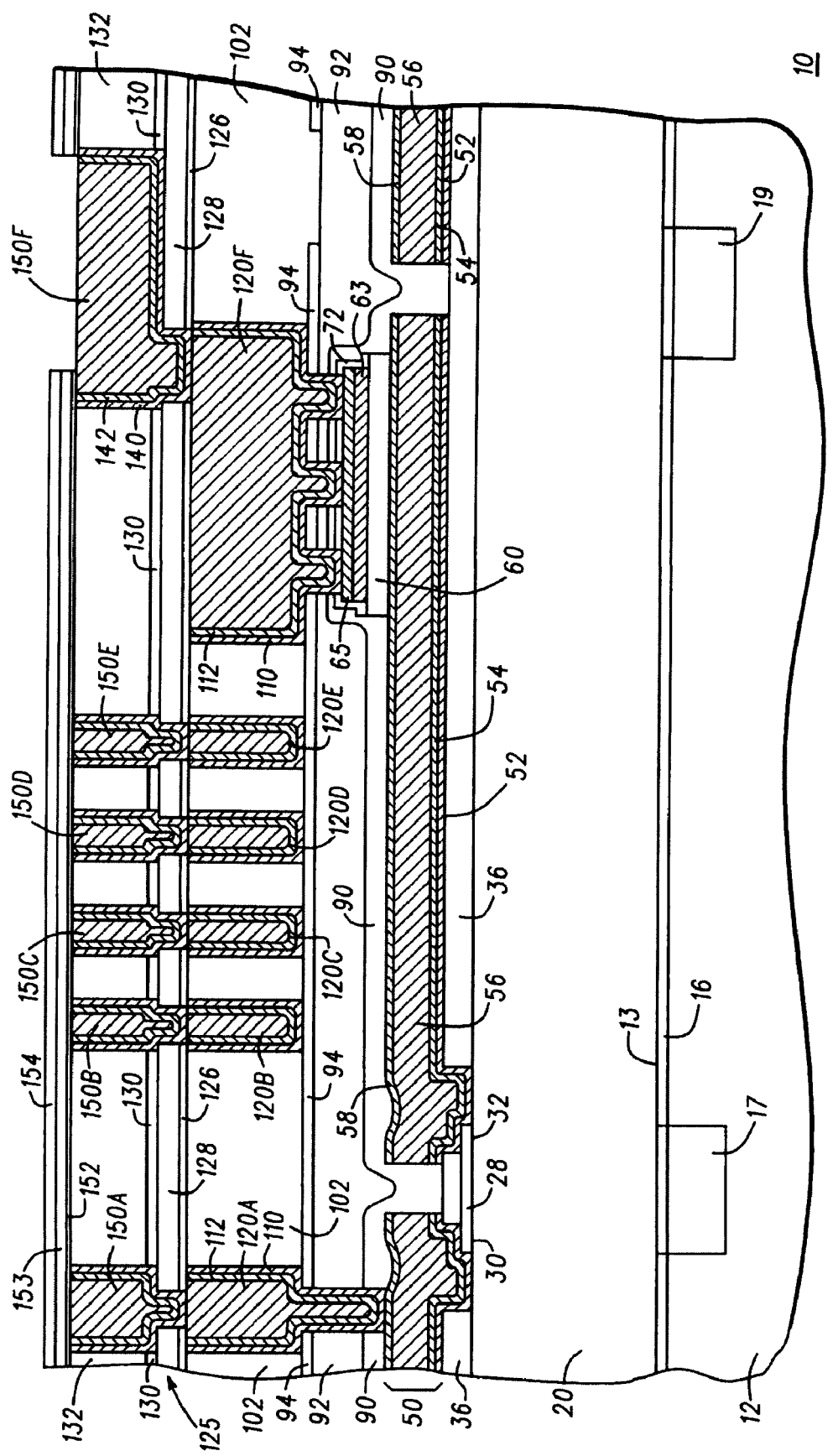
FIG. 22 is a cross-sectional view of the semiconductor component of FIG. 21 at a later stage of manufacture.

Referring now to FIG. 22, the portion of dielectric layer 154 exposed by opening 155 is anisotropically etched using, for example, a reactive ion etch. In addition, the portions of dielectric layers 153 and 152 below the exposed portion of dielectric layer 154 are anisotropically etched. Electrical conductor 150E serves as an etch stop layer for the etch and as a bond pad for semiconductor component 10.

Figure 23:
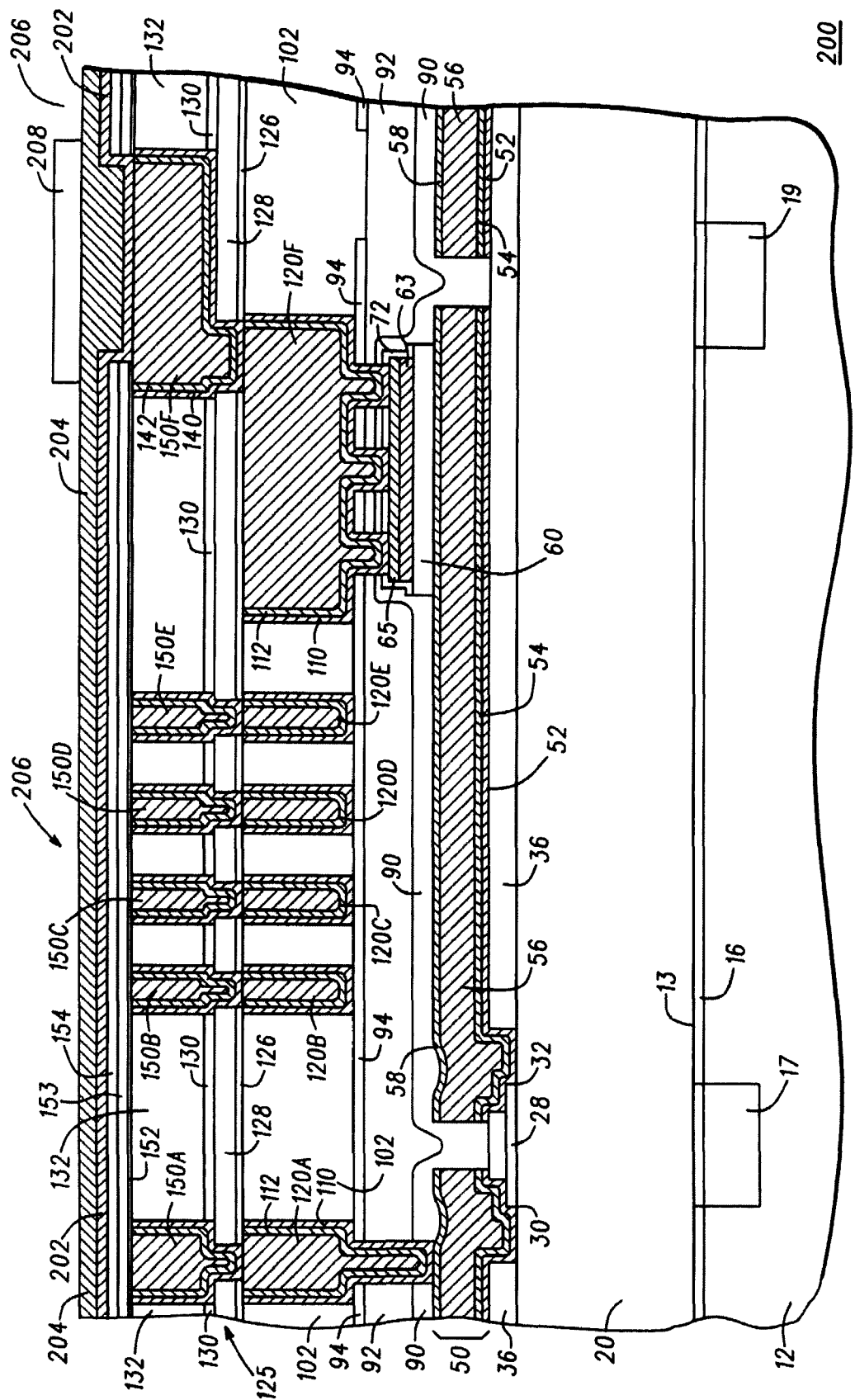
FIG. 23 is a cross-sectional view of a semiconductor component during manufacture in accordance with an embodiment of the present invention.

FIG. 23 is a cross-sectional view of a semiconductor component 200 during manufacture in accordance with another embodiment of the present invention. The description of FIG. 23 continues from that of FIG. 22 and provides a bonding pad that comprises aluminum. A layer of a refractory metal 202 such as, for example, tantalum having a thickness ranging from about 100 Å to about 2,000 Å is formed on dielectric layer 154 and conductor 150F. Other suitable metals for layer 202 include tantalum nitride (TaN), titanium nitride (TiN), titanium tungsten (TiW), or the like. A layer of aluminum 204 having a thickness ranging from about 5,000 Å to about 20,000 Å is formed on tantalum layer 202. A layer of photoresist is formed on aluminum layer 204 and patterned to have openings 206. The remaining portion of the photoresist layer serve as a masking structure 208.

Figure 24:
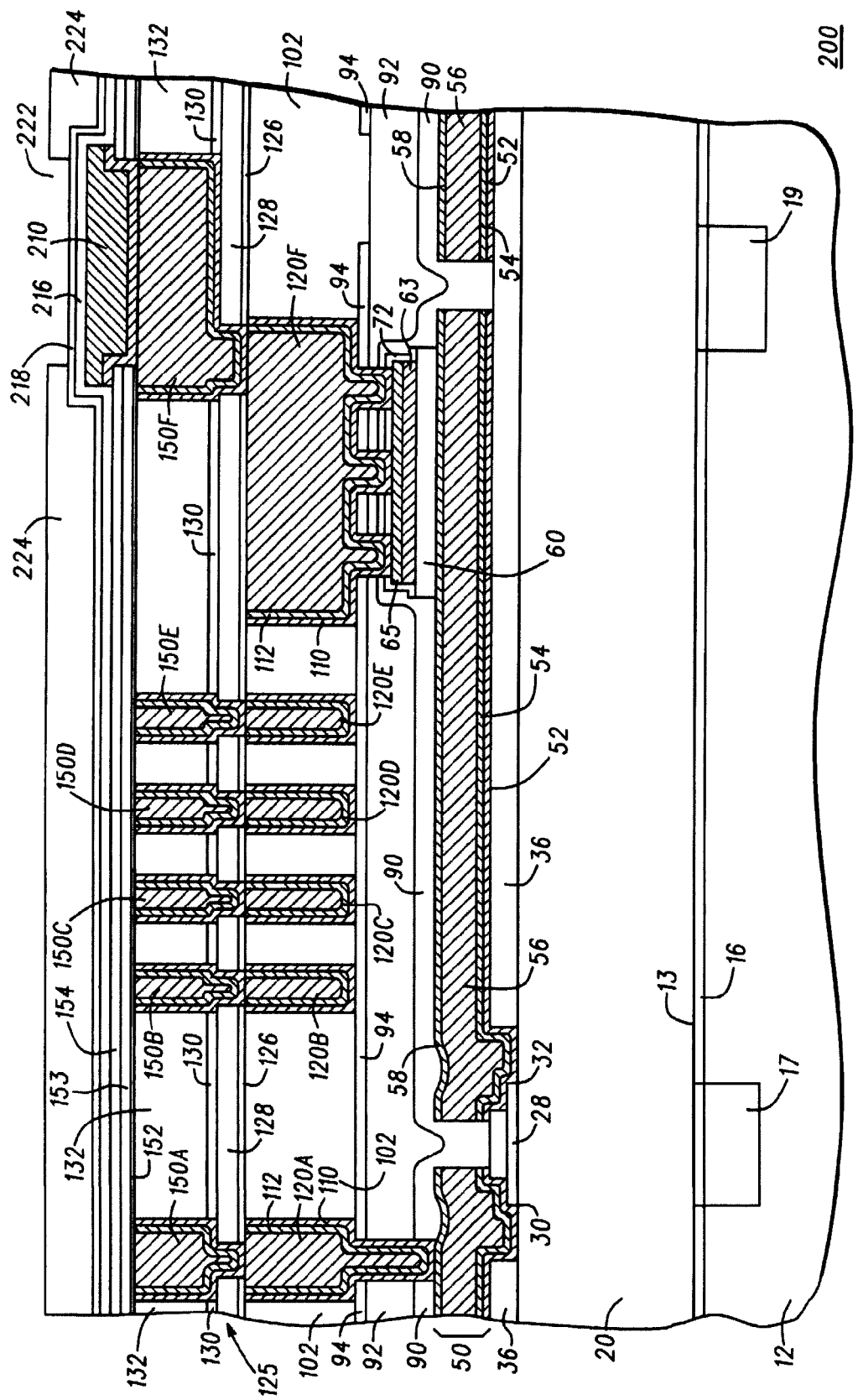
FIG. 24 is a cross-sectional view of the semiconductor component of FIG. 23 at a later stage of manufacture.

Referring now to FIG. 24, the portions of aluminum layer 204 and tantalum layer 202 that are unprotected by masking structure 208 are anisotropically etched using, for example, a reactive ion etch to form an electrical contact or pad 210. A layer of dielectric material 216 having a thickness ranging from about 5,000 Å to about 20,000 Å is formed on dielectric layer 154 and electrical contact 210 and a layer of dielectric material 218 having a thickness ranging from about 500 Å to about 15,000 Å is formed on dielectric layer 216. By way of example, dielectric layer 216 is silicon dioxide formed by the decomposition of tetraethylorthosilicate and dielectric layer 218 is silicon nitride formed using a plasma enhanced chemical vapor deposition technique. A layer of photoresist is formed on dielectric layer 218 and patterned to have an opening 222 that exposes a portion of dielectric layer 218. The remaining portions of the photoresist layer serve as a masking structure 224.

Figure 25:
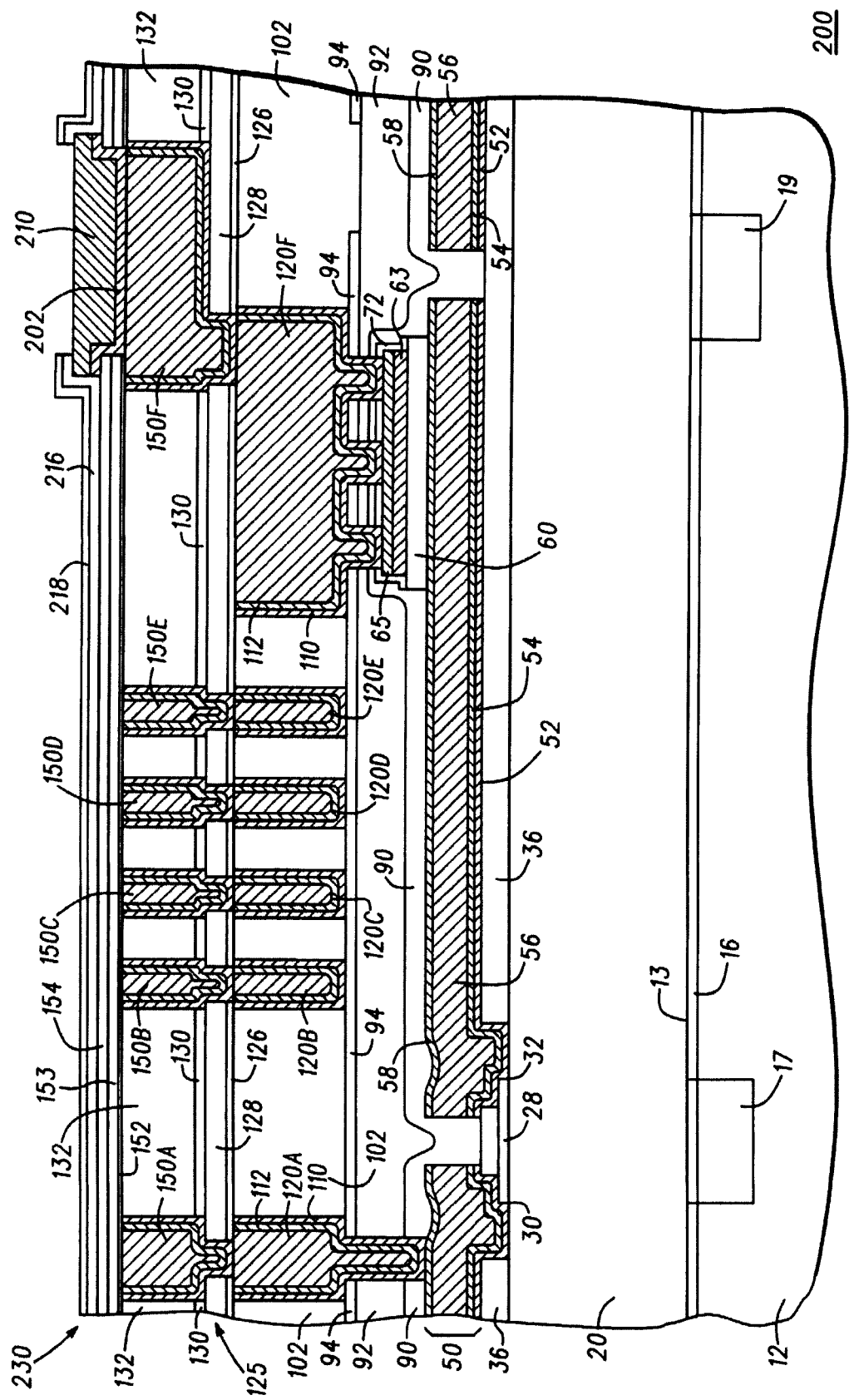
FIG. 25 is a cross-sectional view of the semiconductor component of FIG. 24 at a later stage of manufacture.

Referring now to FIG. 25, the portions of dielectric layers 218 and 216 unprotected by masking structure 224 are anisotropically etched to expose electrical contact 210. The remaining portions of dielectric layers 218 and 216 cooperate to form a passivation structure 230. Electrical contact 210 may serve as an aluminum bonding pad.

Figure 26:
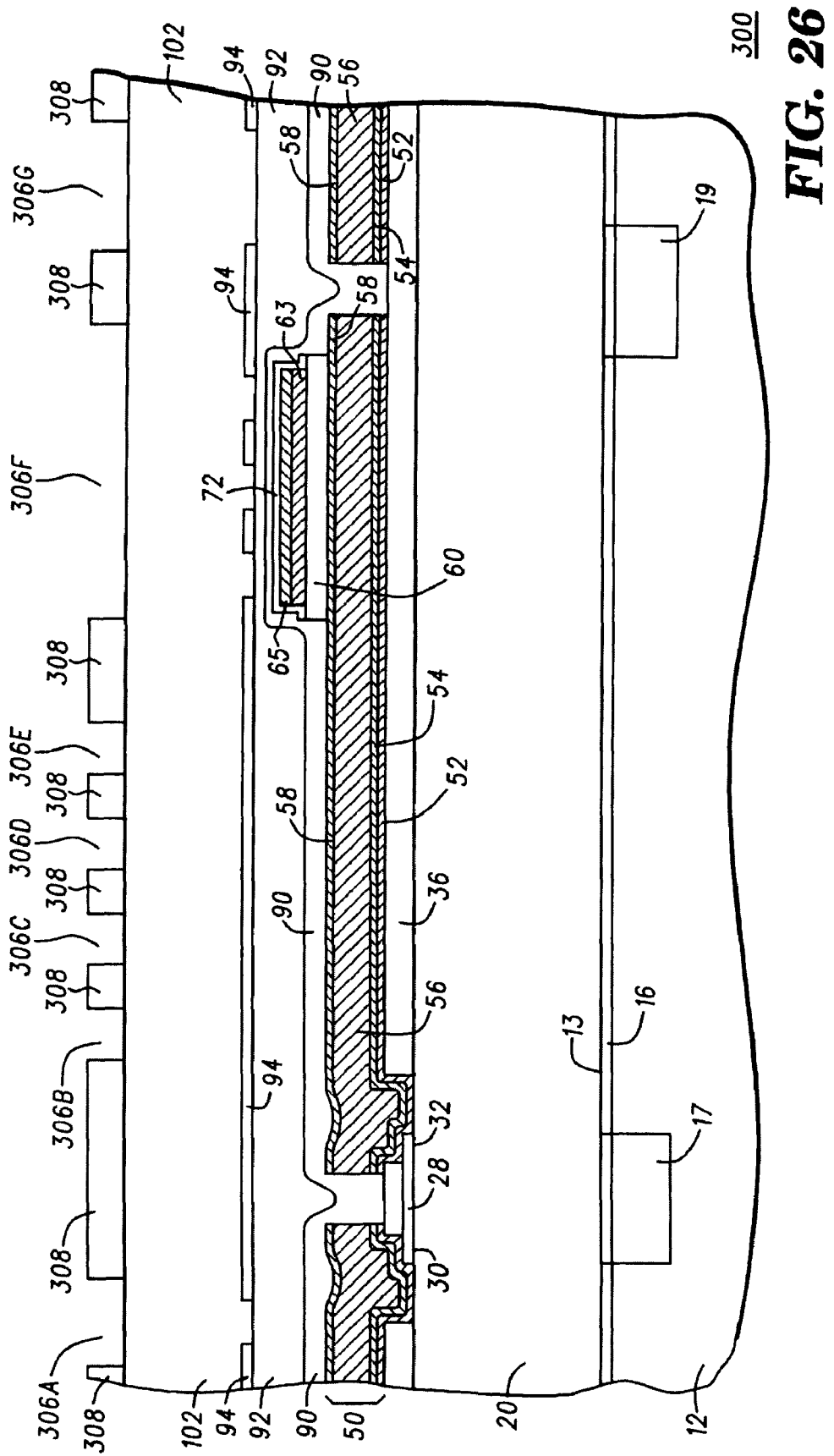
FIG. 26 is a cross-sectional view of a semiconductor component during manufacture in accordance with an embodiment of the present invention.

FIG. 26 is a cross-sectional view of a semiconductor component 300 in accordance with another embodiment of the present invention. It should be noted that the description of FIG. 26 continues from that of FIG. 11. A layer of dielectric material 102 is formed on dielectric layer 94 and in openings 100A-100E. A layer of photoresist is formed on dielectric layer 102 and patterned to have openings 306A, 306B, 306C, 306D, 306E, 306F, and 306G. The remaining portions of the photoresist layer serve as a masking structure 308.

Figure 27:
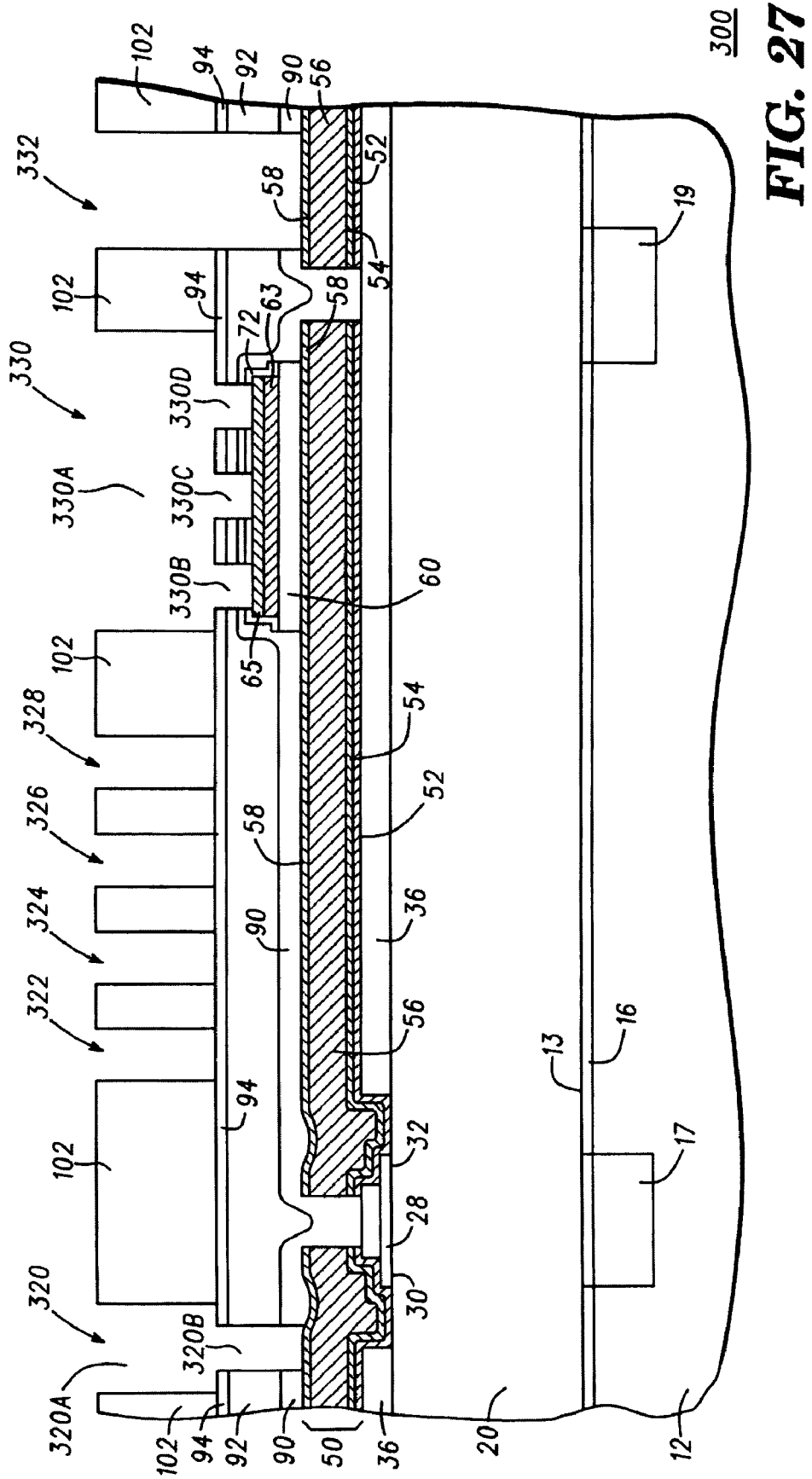
FIG. 27 is a cross-sectional view of the semiconductor component of FIG. 26 at a later stage of manufacture.

Referring now to FIG. 27, the portions of dielectric layer 102 exposed by openings 306A-306F are anisotropically etched using, for example, a reactive ion etch. Dielectric layer 94 serves as an etch stop layer. Thus, dielectric layer 94 protects portions of dielectric layer 92 from the etchant. The portions of dielectric layer 92 unprotected by dielectric layer 94 are removed using the anisotropic etch. Anisotropically etching the portions of dielectric layer 92 re-opens openings 100A-100E (shown in FIG. 1) after which the portions of dielectric layers 92 and 90 that are unprotected by dielectric layer 94 are etched. Metallization systems 50 and 62 serve as etch stops. It should be noted that etching dielectric layers 94, 92, and 90 forms openings 320, 322, 324, 326, 328, 330, and 332, where opening 320 has portions 320A and 320B and opening 330 has portions 330A, 330B, 330C, and 330D. Regarding opening 320, portion 320A is formed in dielectric layer 102 and portion 320B is formed in dielectric layers 92 and 90. Regarding opening 330, portion 330A is formed in dielectric layer 102 and portions 330B, 330C, and 330D are formed in dielectric layers 92 and 90.

Figure 28:
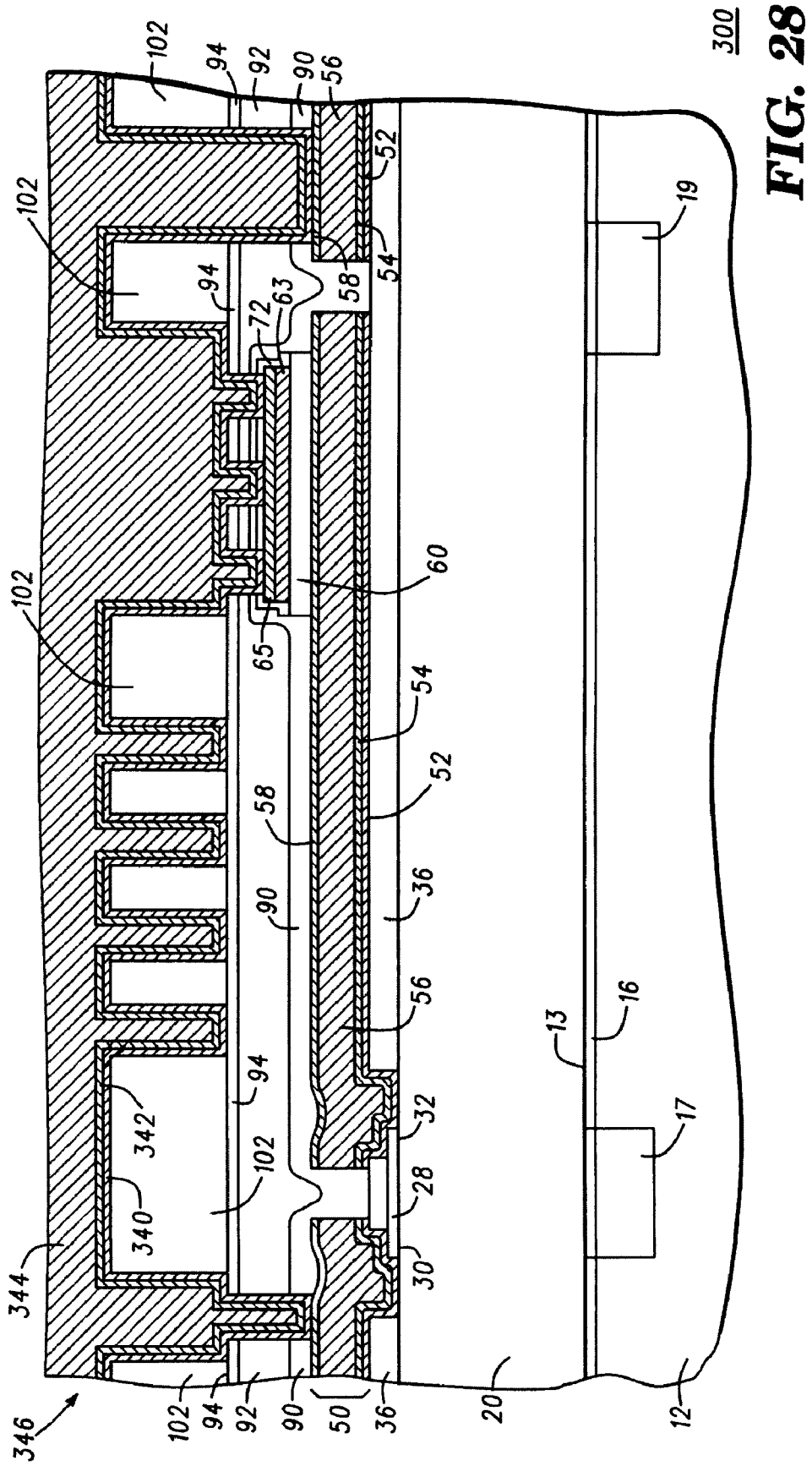
FIG. 28 is a cross-sectional view of the semiconductor component of FIG. 27 at a later stage of manufacture.

Referring now to FIG. 28, a layer of a refractory metal 340 such as, for example, tantalum is formed on dielectric layer 92 and in openings 320-332, a layer of copper 342 is formed on tantalum layer 340, and a layer of copper 344 is formed on copper layer 342. Layers 344, 342, and 340 form a metallization system 346.

Figure 29:
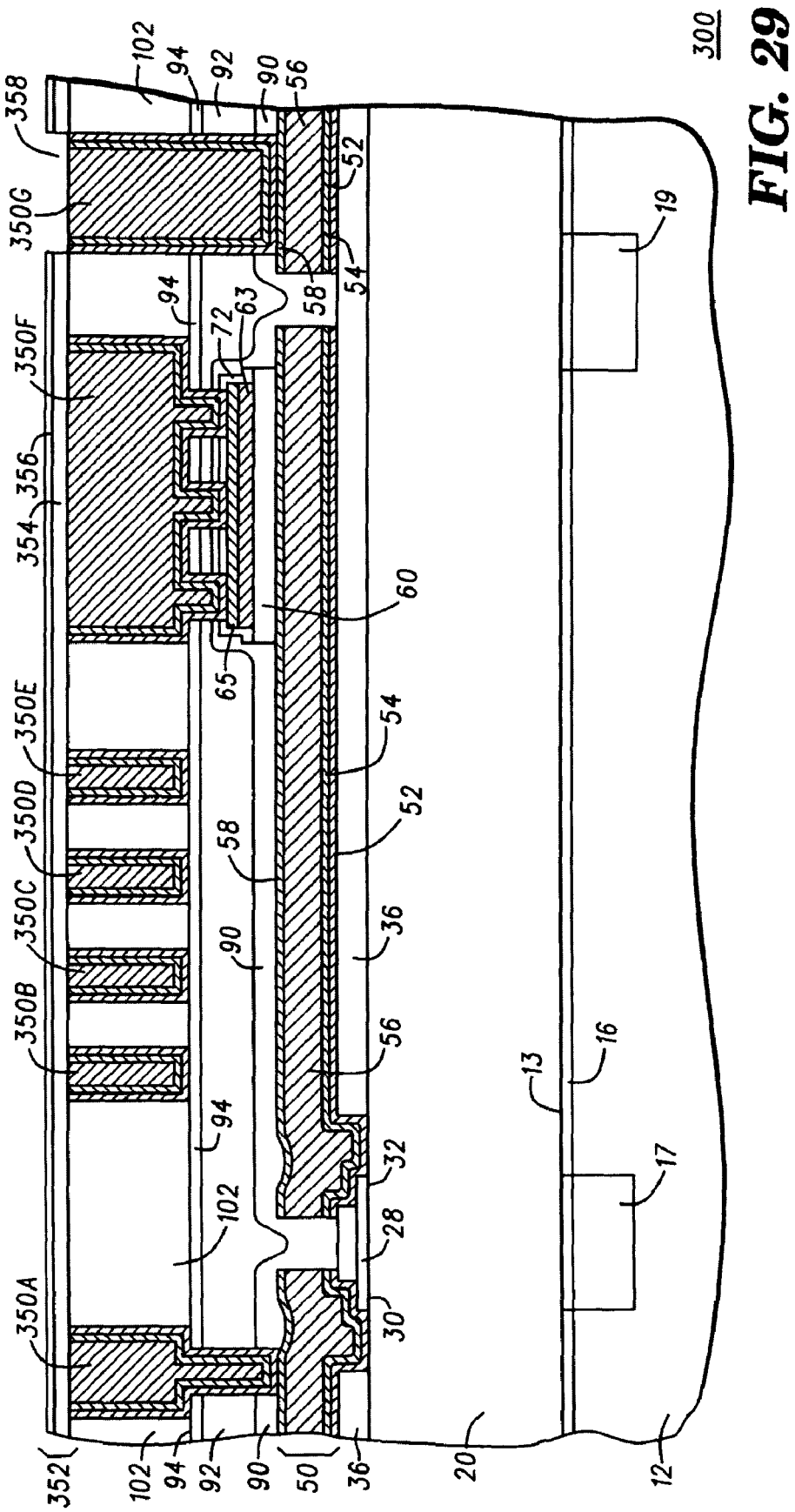
FIG. 29 is a cross-sectional view of the semiconductor component of FIG. 28 at a later stage of manufacture.

Referring now to FIG. 29, metallization system 346 is planarized using, for example, a chemical mechanical planarization technique and an etch chemistry suitable for etching copper. Planarizing metallization system 346 leaves conductors 350A, 350B, 350C, 350D, 350E, 350F, and 350O in openings 320, 322, 324, 326, 328, 330, and 332, respectively. A passivation structure 352 that is similar to passivation structure 230 (shown in FIG. 25) is formed on dielectric layer 102 and conductors 350A-350O. It should be noted that passivation structure 352 may be comprised of dielectric layers 356 and 354 which are analogous to dielectric layers 218 and 216, respectively. An opening 358 exposes conductor 350G, which may serve as a bond pad.

Figure 30:
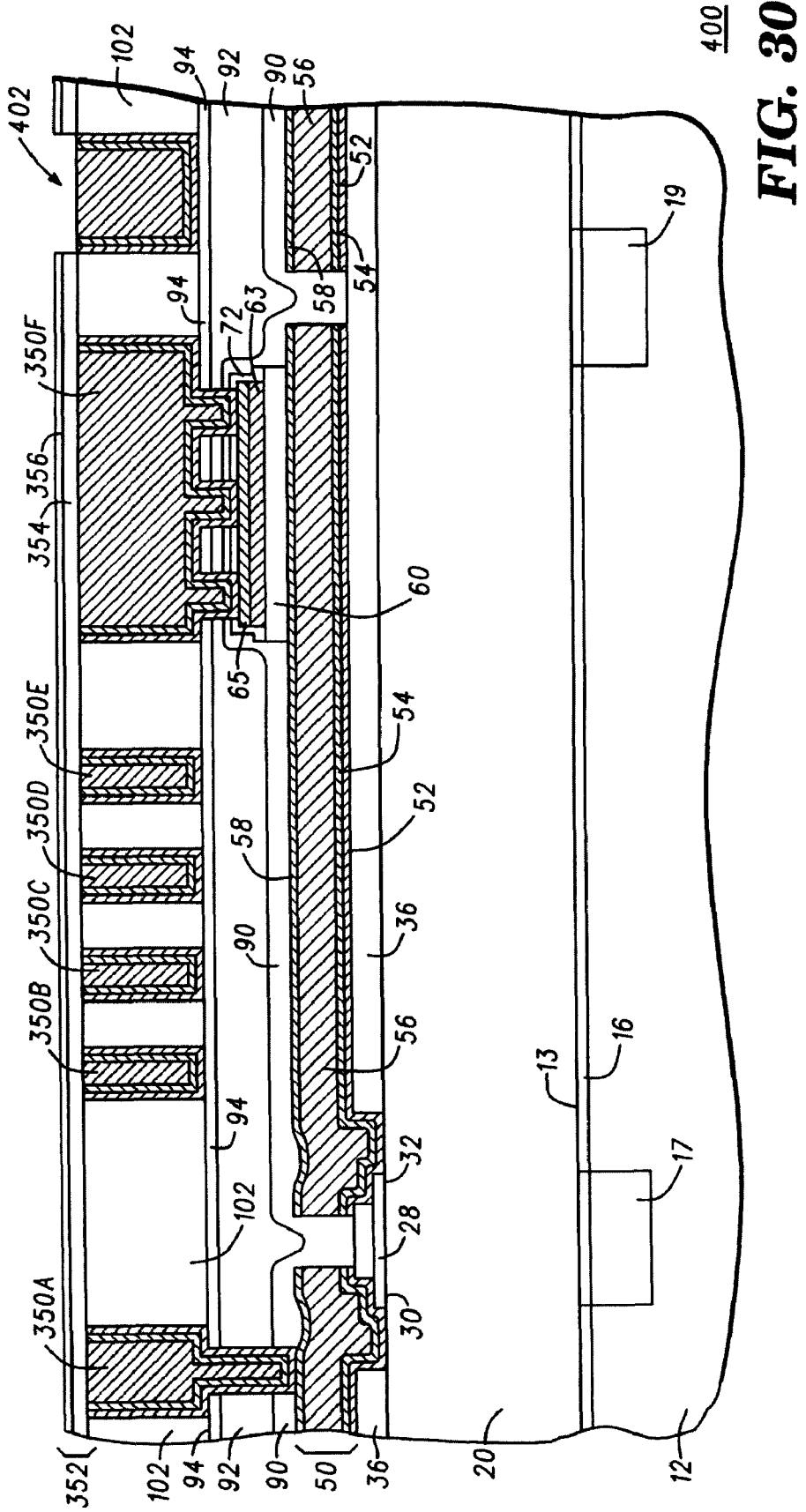
FIG. 30 is a cross-sectional view of a semiconductor component during manufacture in accordance with an embodiment of the present invention.

FIG. 30 is a cross-sectional view of a semiconductor component 400 during manufacture in accordance with another embodiment of the present invention. The formation of semiconductor component 400 is similar to that of semiconductor component 300 except that opening 96E is not formed in masking structure 98 shown in FIG. 10 and opening 100E in dielectric layer 94 is not formed as shown in FIG. 11. Thus, conductors 350A, 350B, 350C, 350D, 350E, and 350F are formed in dielectric layer 102. Because the portion of dielectric layer 94 that was exposed by opening 96E (shown in FIG. 10) is not exposed during the manufacture of semiconductor component 400, conductor 350G is not formed in semiconductor component 400. Rather, a conductor 402 is formed in dielectric layer 102 that is similar to conductor 350G except that is spaced apart from metallization system 50 by portions of dielectric layers 94, 92, and 90. Bumps may be formed on conductor 402.

Figure 31:
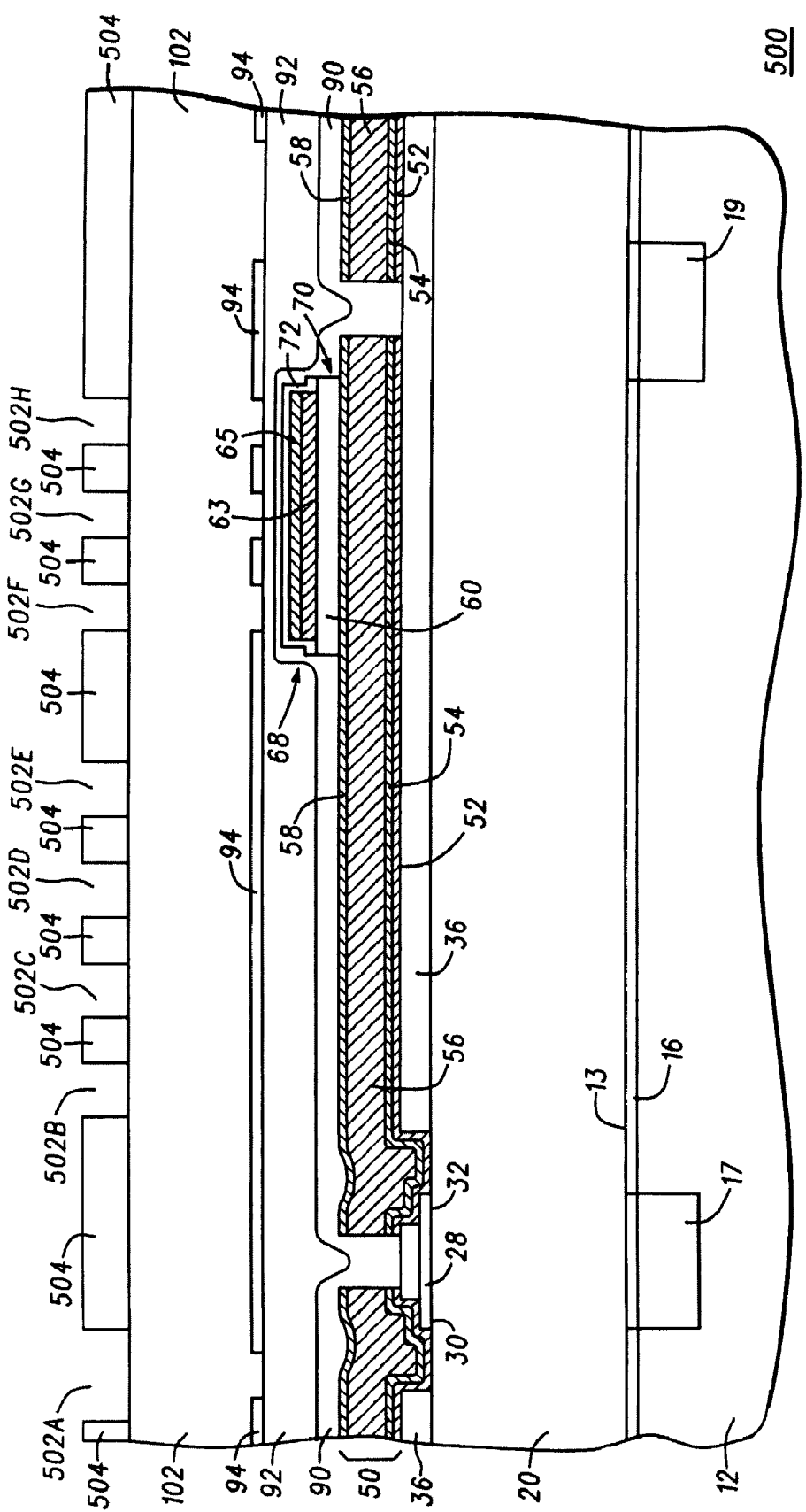
FIG. 31 is a cross-sectional view of a semiconductor component during an early stage of manufacture in accordance with another embodiment of the present invention.

Referring now to FIG. 31, a cross-sectional view of a semiconductor component 500 in accordance with another embodiment of the present invention is shown. It should be noted that the beginning steps in the formation of semiconductor component 500 may be the same as those for the manufacture of semiconductor component 10. Accordingly, the description of FIG. 31 continues from that of FIG. 11. A layer of dielectric material 102 is formed on dielectric layer 94 and in openings 100A-100E. A layer of photoresist is formed on dielectric layer 102 and patterned to have openings 502A, 502B, 502C, 502D, 502E, 502F, 502G, and 502H. The remaining portions of the photoresist layer serve as a masking structure 504.

Figure 32:
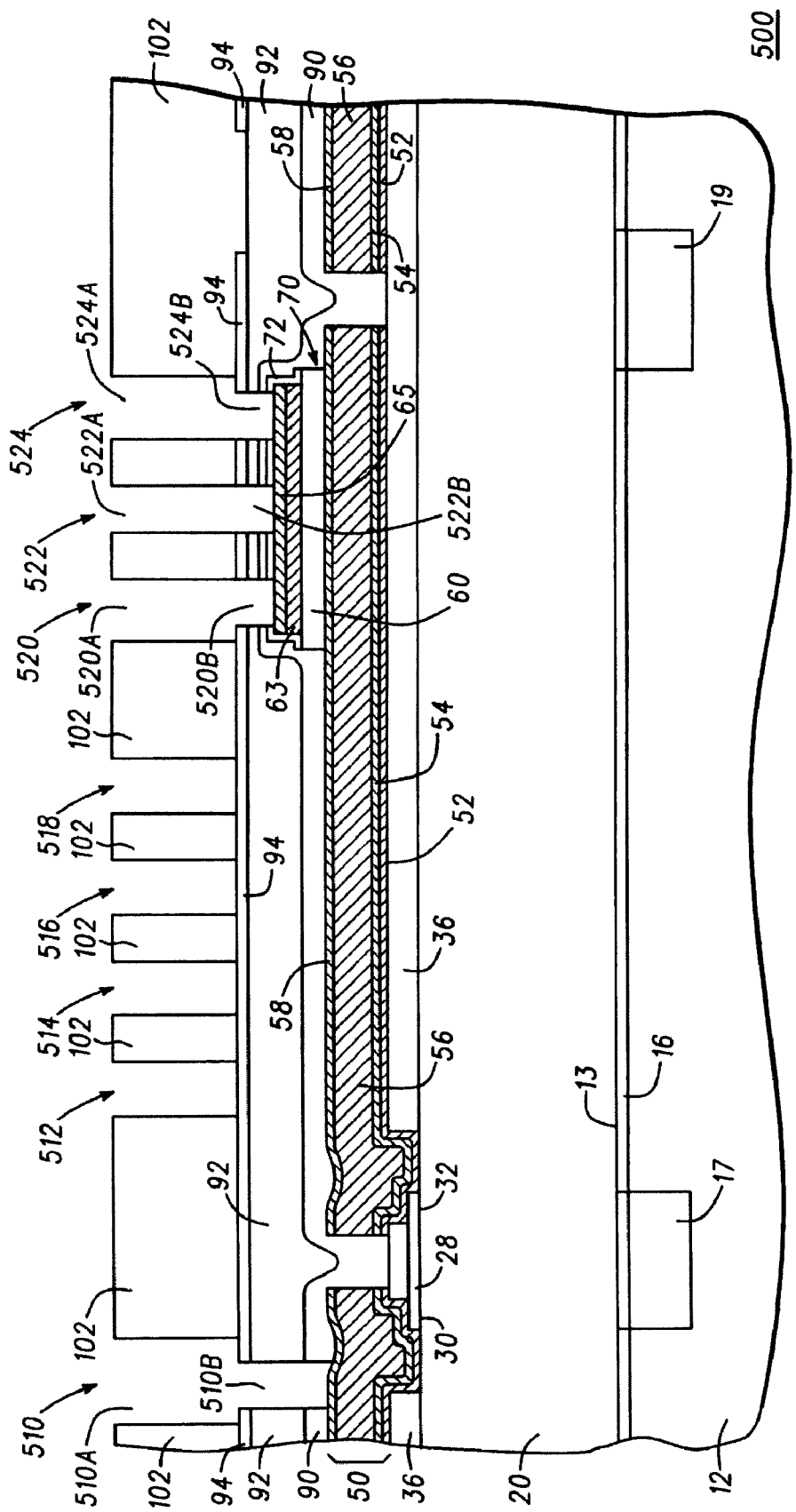
FIG. 32 is a cross-sectional view of the semiconductor component of FIG. 31 at a later stage of manufacture.

Referring now to FIG. 32, the portions of dielectric layer 102 exposed by openings 502A-502H are anisotropically etched using, for example, a reactive ion etch. Dielectric layer 94 serves as an etch stop layer. Thus, dielectric layer 94 protects portions of dielectric layer 92 from the etchant. However, the portions of dielectric layer 92 unprotected by dielectric layer 94 are removed using the anisotropic etch. Anisotropically etching the portions of dielectric layer 92 re-opens openings 100A-106D (shown in FIG. 11) after which the portions of dielectric layers 92 and 90 that are unprotected by dielectric layer 94 are etched. Metallization systems 50 and 62 serve as etch stops. It should be noted that etching dielectric layers 102, 94, 92, and 90 forms openings or vias 510, 512, 514, 516, 518, 520, 522, and 524, where opening 510 has portions 510A and 510B, opening 520 has portions 520A and 520B, opening 522 has portions 522A and 522B, and opening 524 has portions 524A and 524B. Regarding opening 510, portion 510A is formed in dielectric layer 102 and portion 501B is formed in dielectric layers 92 and 90. Likewise opening 520 includes a portion 520A that is formed in dielectric layer 102 and portion 520B that is formed in dielectric layers 92 and 90; opening 522 includes a portion 522A that is formed in dielectric layer 102 and portion 522B that is formed in dielectric layers 92 and 90; and opening 524 includes a portion 524A that is formed in dielectric layer 102 and portion 524B that is formed in dielectric layers 92 and 90. Masking structure 504 is removed.

Figure 33:
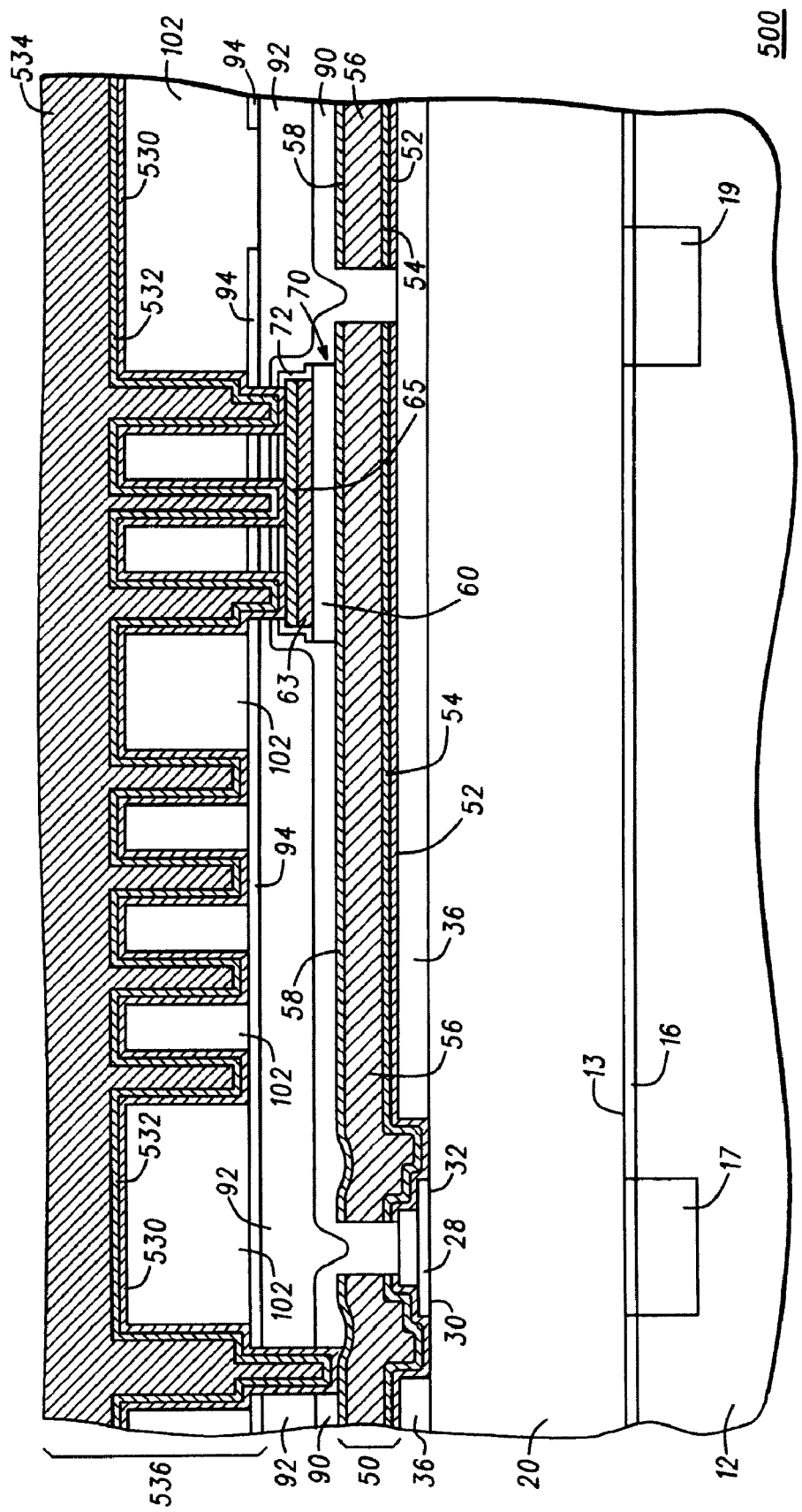
FIG. 33 is a cross-sectional view of the semiconductor component of FIG. 32 at a later stage of manufacture.

Referring now to FIG. 33, a layer of a refractory metal 530 such as, for example, tantalum is formed on dielectric layer 92 and in openings 510-524, a layer of copper 532 is formed on tantalum layer 530, and a layer of copper 534 is formed on copper layer 532. Layers 530, 532, and 534 form a metallization system 536.

Figure 34:
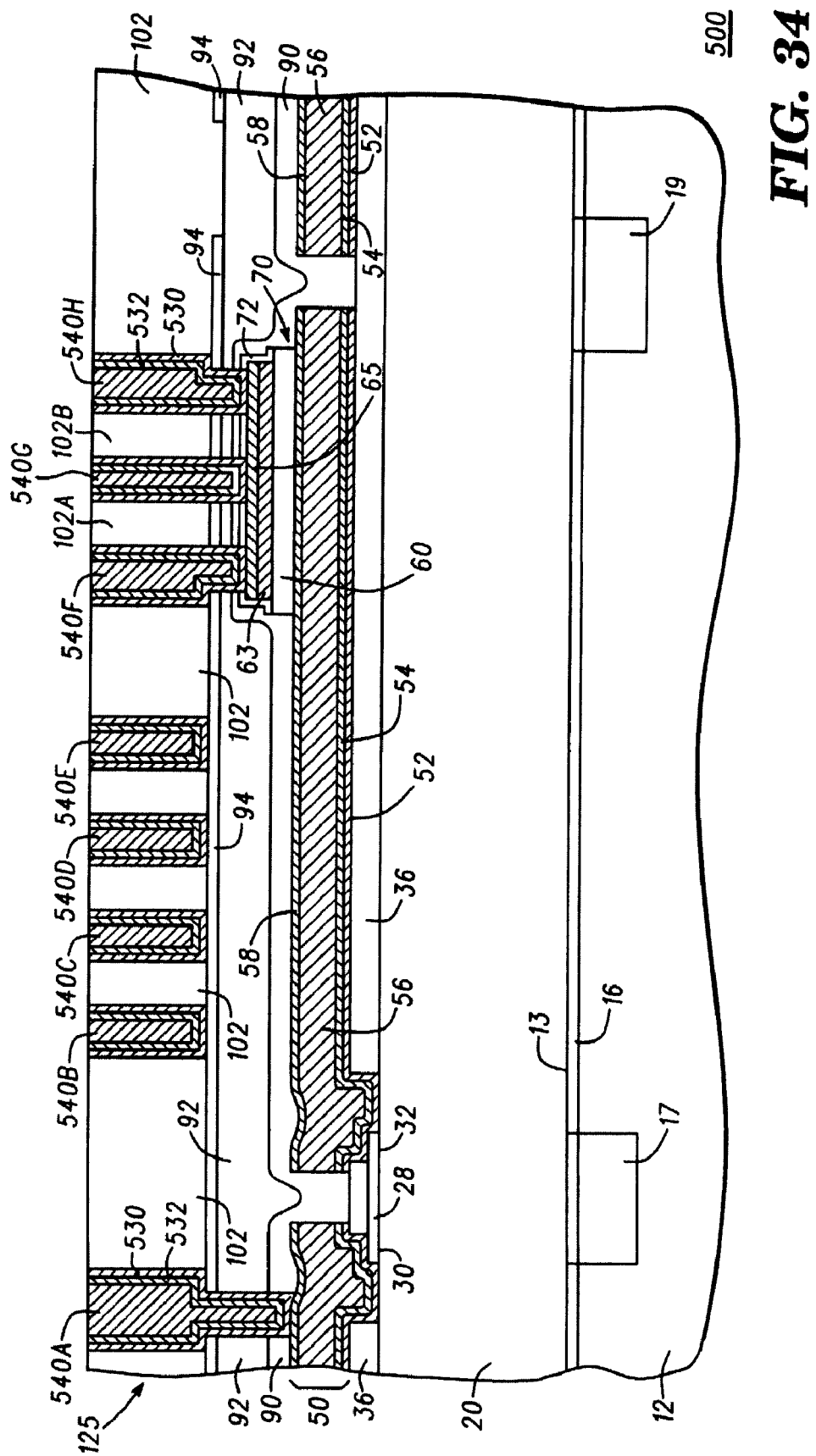
FIG. 34 is a cross-sectional view of the semiconductor component of FIG. 33 at a later stage of manufacture.

Referring now to FIG. 34, metallization system 536 is planarized using, for example, a chemical mechanical planarization technique and an etch chemistry suitable for etching copper. Planarizing metallization system 536 leaves conductors 540A, 540B, 540C, 540D, 540E, 540F, 540G, and 540H in openings 510, 512, 514, 516, 518, 520, 522, and 524, respectively. Portion 102A of dielectric layer 102 remains between conductors 540F and 540G and portion 102B of dielectric layer 102 remains between conductors 540G and 540H. Portions 102A and 102B inhibit delamination and cracking that may occur if they were replaced by a metal such as copper. It should be noted that conductors 540A-540H are formed using a damascene process and that conductors 540A-540H and dielectric layers 102, 94, 92 and 90 are referred to as damascene structures. Conductors 540A-540E may form a portion of an inductor 125.

Figure 35:
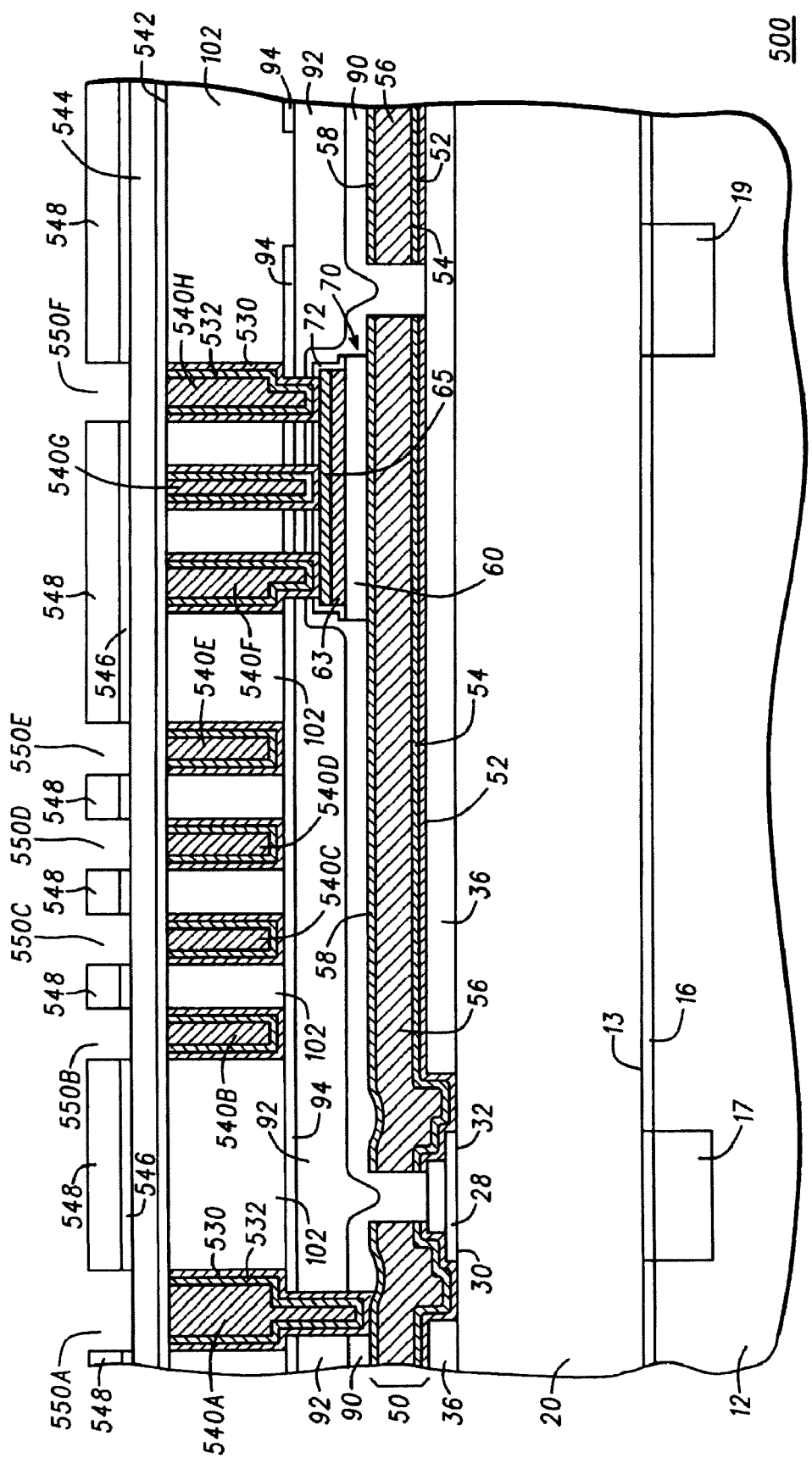
FIG. 35 is a cross-sectional view of the semiconductor component of FIG. 34 at a later stage of manufacture.

Referring now to FIG. 35, a layer of dielectric material 542 having a thickness ranging from about 100 Å to about 1,000 Å is formed on dielectric layer 102 and conductors 540A-540H and a layer of dielectric material 544 having a thickness ranging from about 7,000 Å to about 60,000 Å is formed on dielectric layer 542. By way of example, before dielectric layer 542 is formed, dielectric layer 102 and conductors 540A-540H are treated with an ammonia ($NH_3$) plasma for a time ranging from about 10 seconds to about 200 seconds followed by the formation of a layer of dielectric material 542 on dielectric layer 102 and conductors 540A-540H. Dielectric layer 542 may be silicon nitride that is formed using, for example, a plasma enhanced chemical vapor deposition technique and dielectric layer 544 may be silicon dioxide formed using a plasma enhanced chemical vapor deposition technique. A layer of dielectric material 546 is formed on dielectric layer 544. The material of dielectric layer 546 may be silicon nitride formed using a plasma enhanced chemical vapor deposition technique. A layer of photoresist is formed on dielectric layer 546 and patterned to have openings that expose portions of dielectric layer 546. The remaining portions of the photoresist layer serve as a masking structure 548. The exposed portions of dielectric layer 546 are anisotropically etched using, for example, a reactive ion etch to form openings 550A, 550B, 550C, 550D, 550E, and 550F in dielectric layer 546, which openings 550A-550F expose portions of dielectric layer 544.

Figure 36:
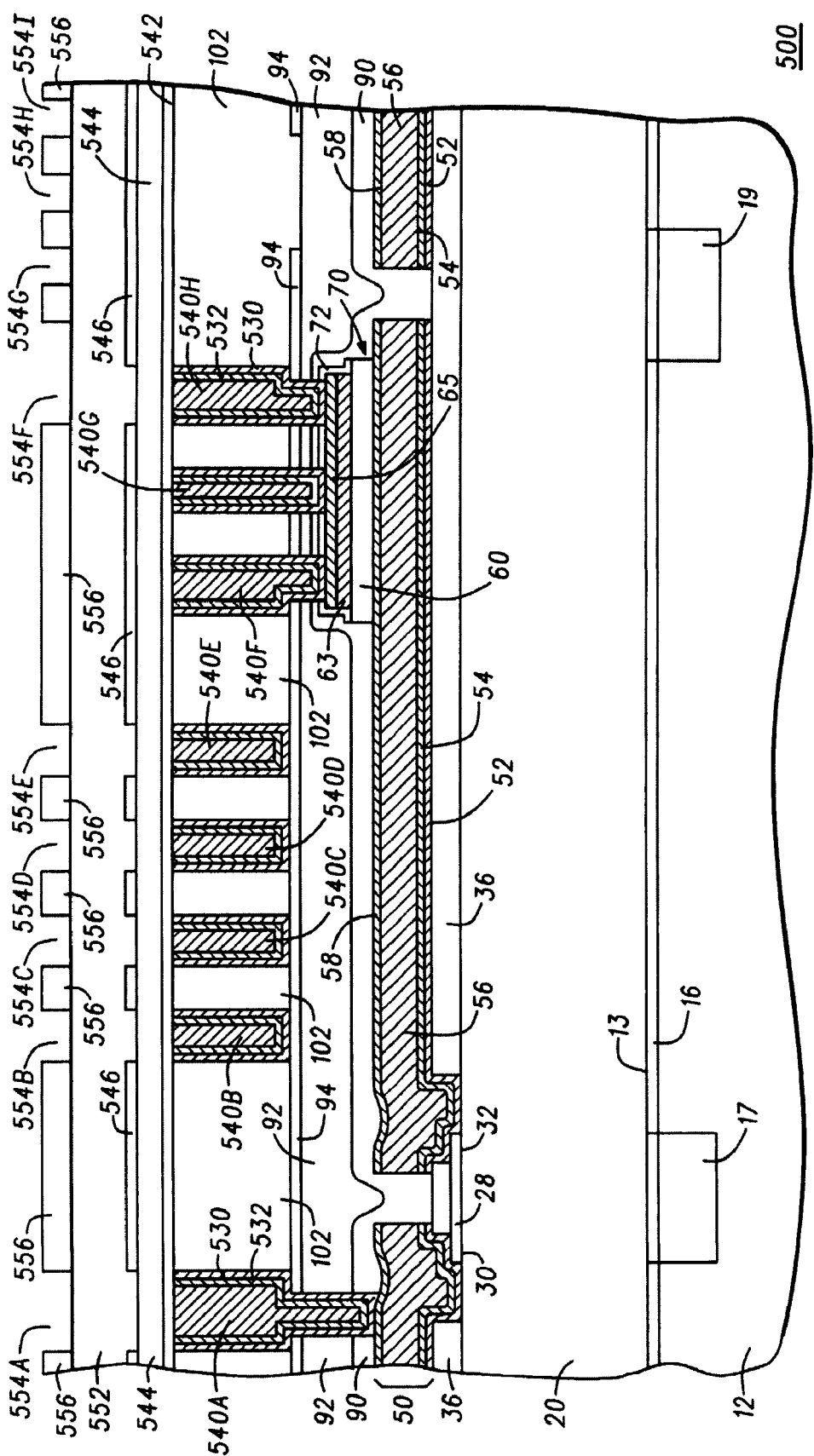
FIG. 36 is a cross-sectional view of the semiconductor component of FIG. 35 at a later stage of manufacture.

Referring now to FIG. 36, a layer of dielectric material 552 is formed on dielectric layer 546. By way of example, dielectric layer 552 is silicon dioxide formed using plasma enhanced chemical vapor deposition and having a thickness ranging from about 45,000 Å to about 100,000 Å. It should be noted that the type of dielectric material and the method of forming the dielectric material are not limited to silicon dioxide formed using plasma enhanced chemical vapor deposition. Other suitable dielectric materials include low-dielectric constant (low-κ) dielectrics such as, for example, diamond or CORAL. Other techniques of forming the dielectric material include decomposition of TEOS, application of a spin-on dielectric, or the like. A layer of photoresist is formed on dielectric layer 552 and patterned to have openings 554A, 554B, 554C, 554D, 554E, 554F, 554G, 554H, and 554I. The remaining portions of the photoresist layer serve as a masking structure 556.

Figure 37:
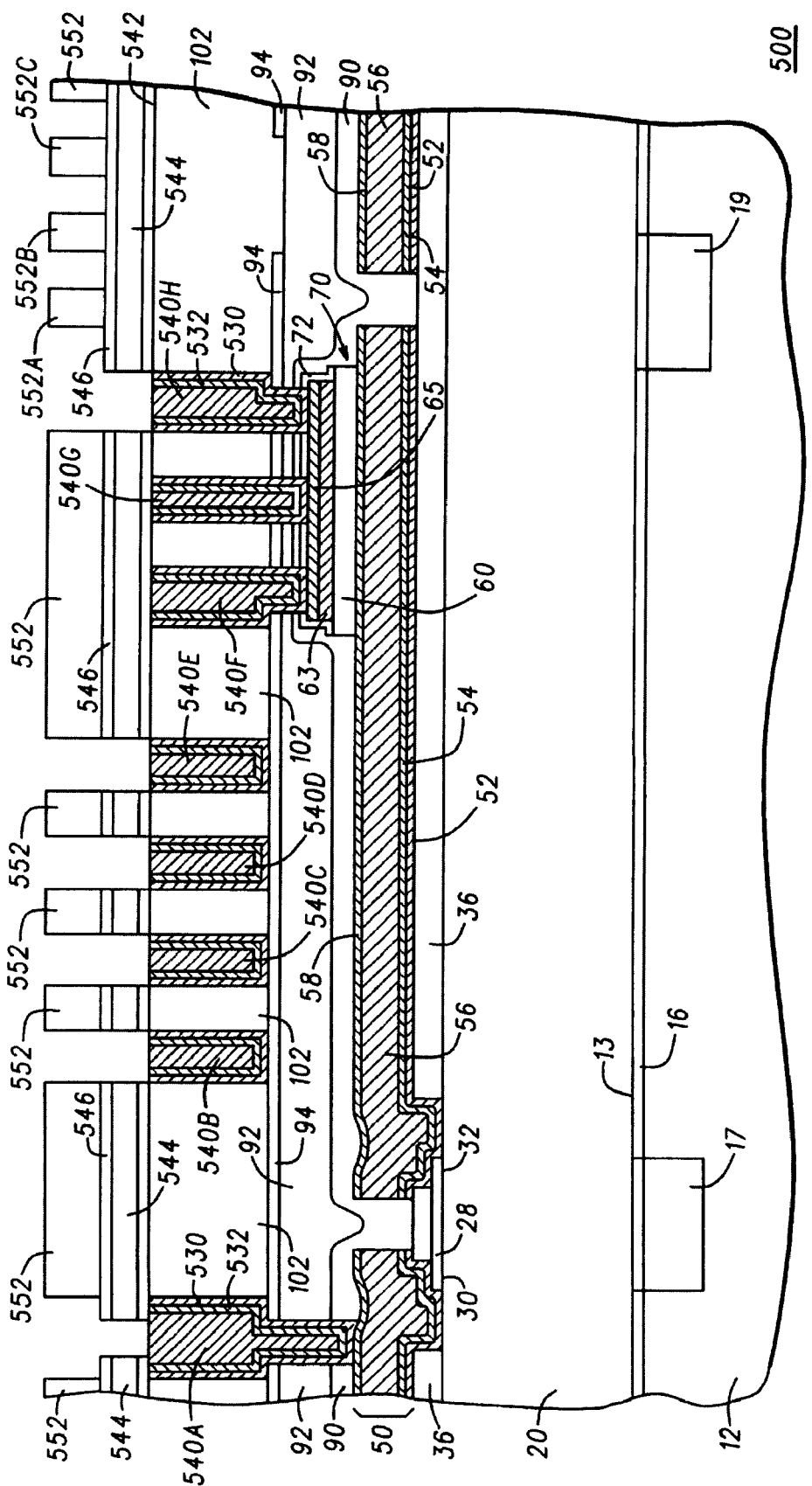
FIG. 37 is a cross-sectional view of the semiconductor component of FIG. 36 at a later stage of manufacture.

Referring now to FIG. 37, the portions of dielectric layer 552 exposed by openings 554A-554I are anisotropically etched using, for example, a reactive ion etch. Dielectric layer 546 serves as an etch stop layer. Thus, dielectric layer 546 protects portions of dielectric layer 544 from the etchant. However, the portions of dielectric layer 544 unprotected by dielectric layer 546 are removed using the anisotropic etch. Like dielectric layer 546, conductors 540A-540E and 540H serve as an etch stop. Anisotropically etching the portions of dielectric layer 552 re-opens openings 550A-550F shown in FIG. 35. It should be noted that portions 552A, 552B, and 552C of dielectric layer 552 remain after anisotropically etching dielectric layer 552.

Figure 38:
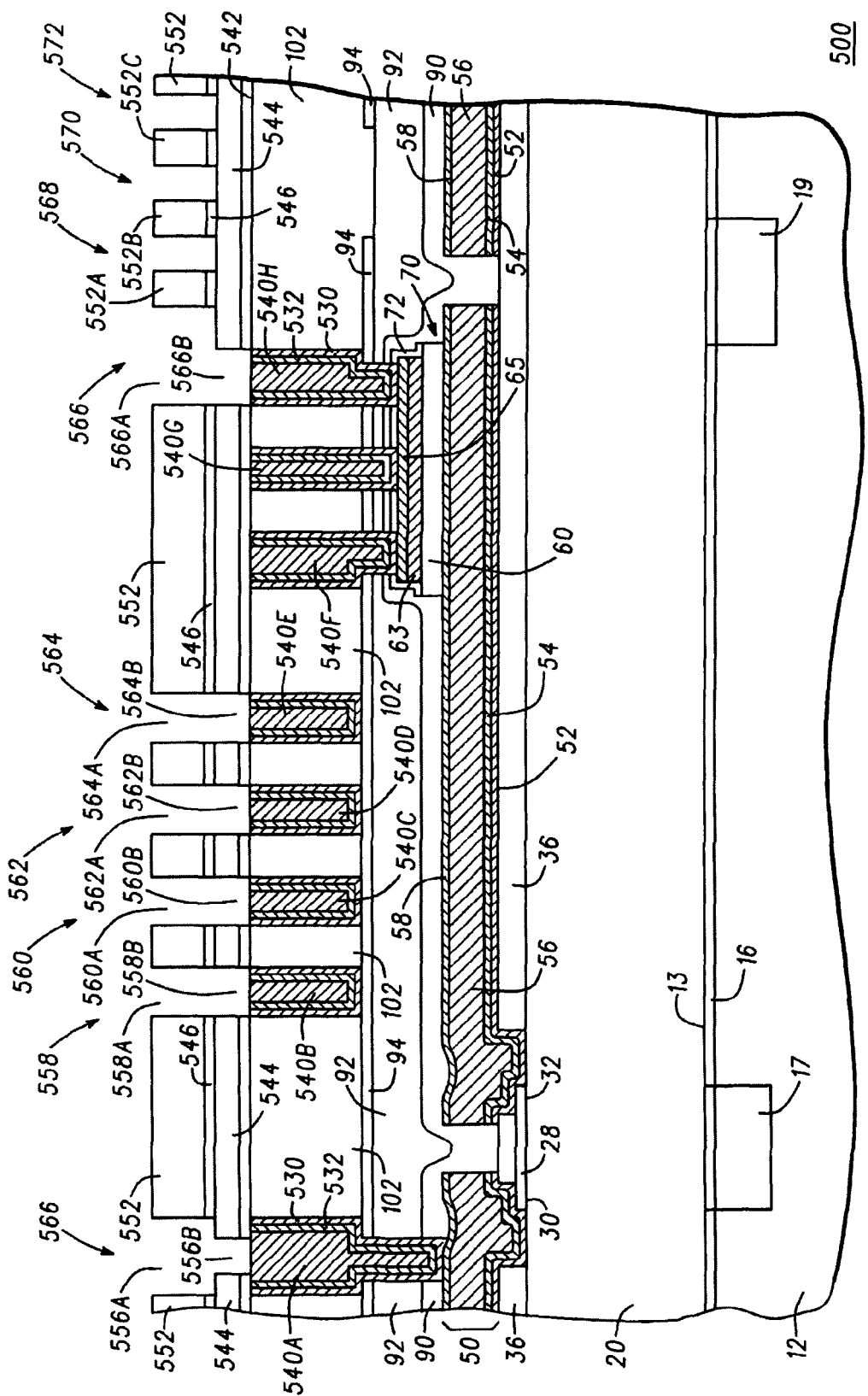
FIG. 38 is a cross-sectional view of the semiconductor component of FIG. 37 at a later stage of manufacture.

Referring now to FIG. 38, the portions of dielectric layer 546 that serve as an etch stop during the etching of dielectric layer 552 and the portion of dielectric layer 542 exposed by the etch process described with reference to FIG. 37 are removed using, for example, an anisotropic etch. It should be noted that etching dielectric layers 552, 546, and 544 forms openings or vias 556, 558, 560, 562, 564, 566, 568, 570, and 572, where opening 556 has portions 556A and 556B, opening 558 has portions 558A and 558B, opening 560 has portions 560A and 560B, opening 562 has portions 562A and 562B, opening 564 has portions 564A and 564B, and opening 566 has portions 566A and 566B.

Figure 39:
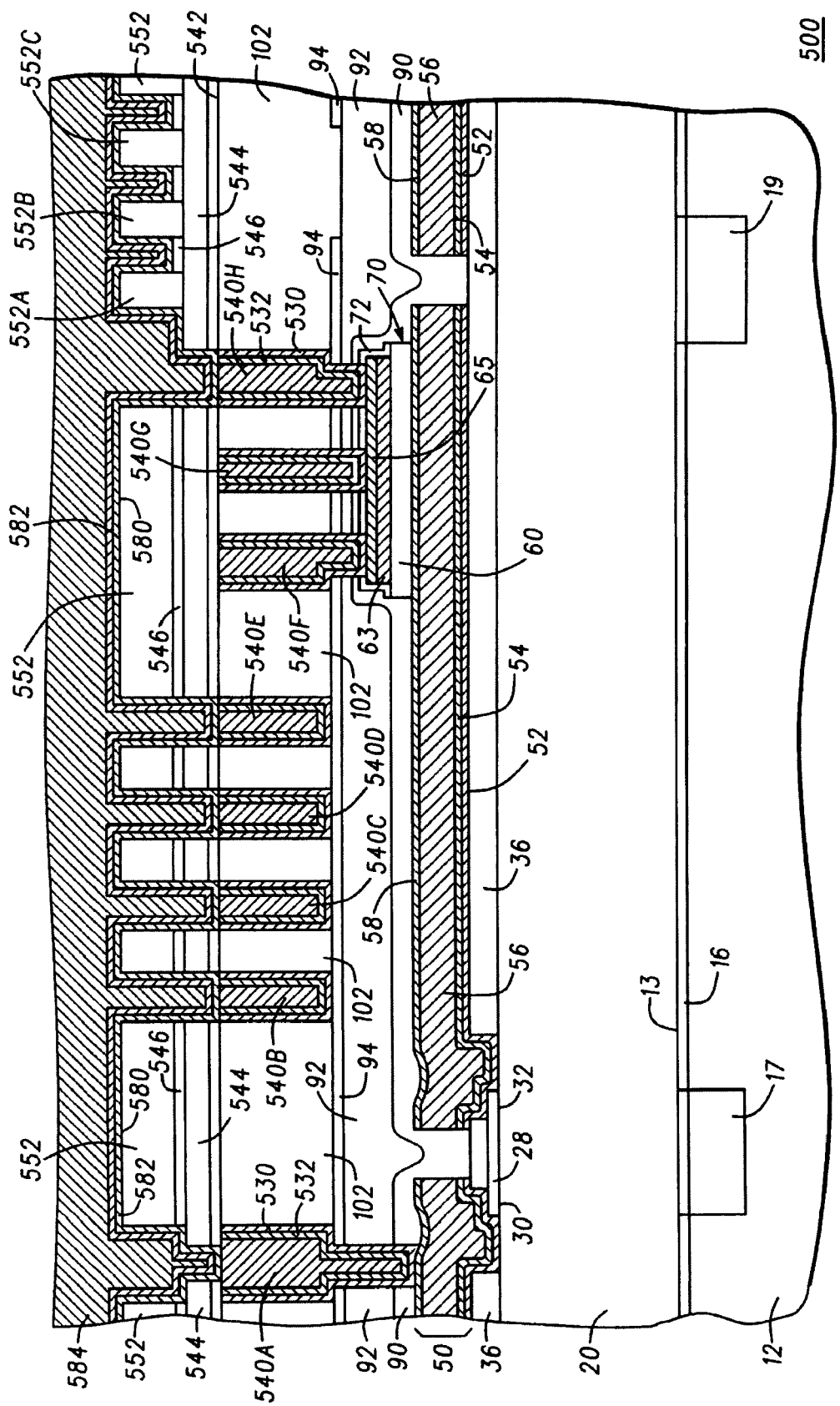
FIG. 39 is a cross-sectional view of the semiconductor component of FIG. 38 at a later stage of manufacture.

Referring now to FIG. 39, a layer of a refractory metal 580 such as, for example, tantalum is formed on dielectric layer 552 and in openings 556-572, a layer of copper 582 is formed on tantalum layer 140, and a layer of copper 584 is formed on copper layer 582. Other suitable metals for refractory metal layer 580 include titanium, titanium nitride, tantalum nitride, titanium tungsten, or the like. Layers 580, 582, and 584 form a metallization system 586.

Figure 40:
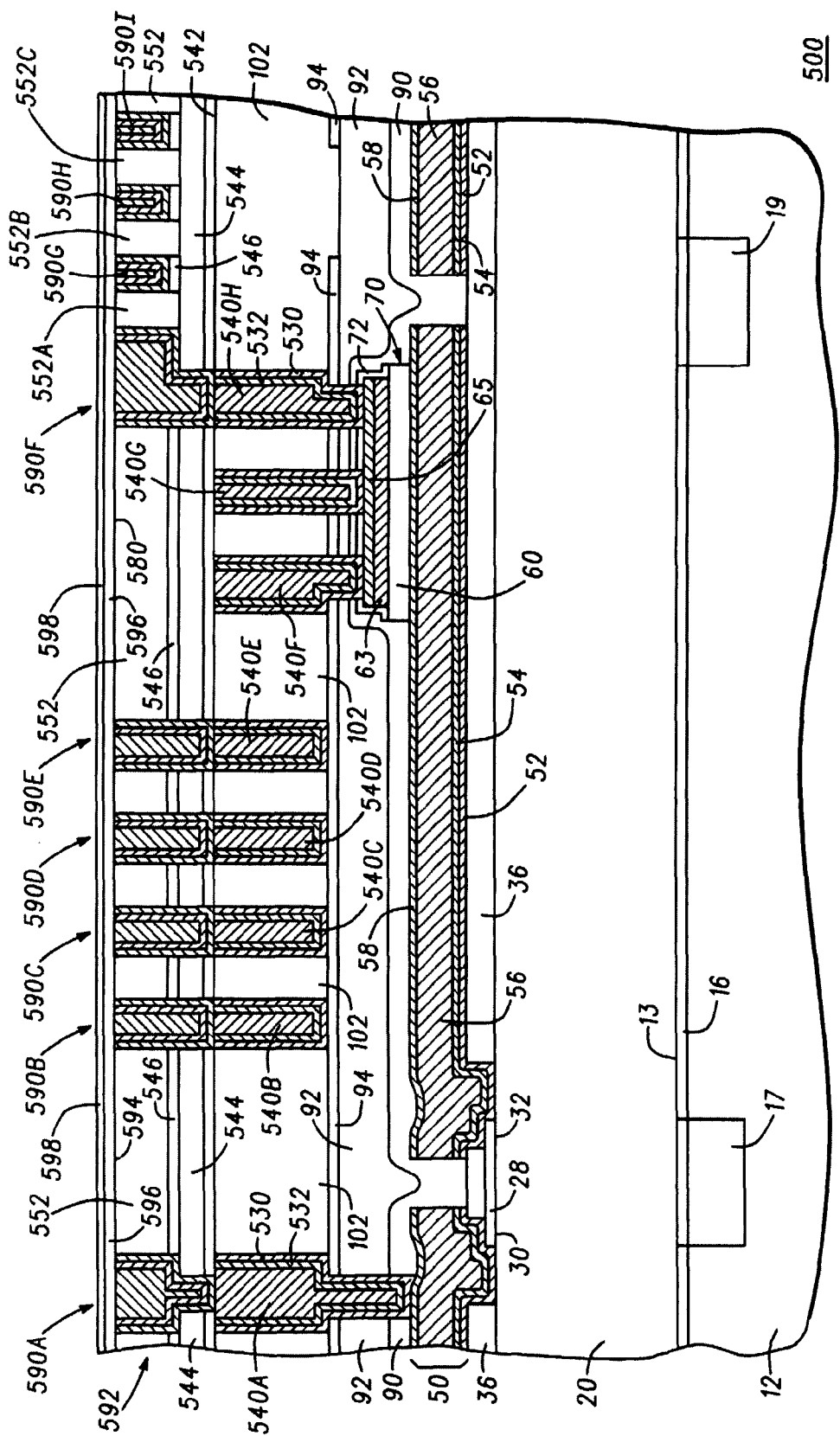
FIG. 40 is a cross-sectional view of the semiconductor component of FIG. 39 at a later stage of manufacture.

Referring now to FIG. 40, metallization system 586 is planarized using, for example, a chemical mechanical planarization technique and an etch chemistry suitable for etching copper. Planarizing metallization system 586 leaves conductors 590A, 590B, 590C, 590D, 590E, 590F, 590G, 590H, and 590I in openings 556, 558, 560, 562, 564, 566, 568, 570, and 572, respectively. It should be noted that conductors 590A-590I are formed using a damascene process and that conductors 590A-590I and dielectric layers 552, 546, 544, and 542 are referred to as damascene structures. It should be further noted that conductors 590A-590F may form a portion of an inductor 592, where conductors 540A and 590A cooperate to form a terminal of inductor 592, conductors 540B and 590B cooperate to form a portion of a winding of inductor 592, conductors 540C and 590C cooperate to form a portion of another winding of inductor 592, conductors 540D and 590D cooperate to form a portion of another winding of inductor 592, conductors 540E and 590E cooperate to form a portion of another winding of inductor 592, and portions 540F and 590F may cooperate to form a portion of terminal of inductor 592.

A layer of dielectric material 594 having a thickness ranging from about 100 Å to about 1,000 Å is formed on dielectric layer 552 and conductors 590A-590I. In accordance with embodiments of the present invention, before forming dielectric layer 594, dielectric layer 552 and conductors 590A-590I are treated with an ammonia ($NH_3$) plasma for a time ranging from about 10 seconds to about 200 seconds followed by the formation of a layer of dielectric material 594 and the formation of dielectric layer 596 on dielectric layer 594. By way of example, dielectric layer 594 is silicon nitride that is formed using, for example, a plasma enhanced chemical vapor deposition technique and dielectric layer 596 is silicon dioxide formed using a plasma enhanced chemical vapor deposition technique. An optional layer of dielectric material 598 is formed on dielectric layer 596. The material of dielectric layer 598 may be silicon nitride formed using a plasma enhanced chemical vapor deposition technique. It should be noted that structures 590G, 590H, and 590I may be dummy structures that are included to balance the stress across a semiconductor wafer.

Figure 41:
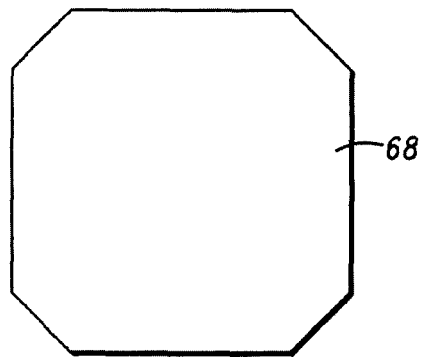
FIG. 41 is a top view of a portion of a semiconductor component in accordance with an embodiment of the present invention.
Figure 42:
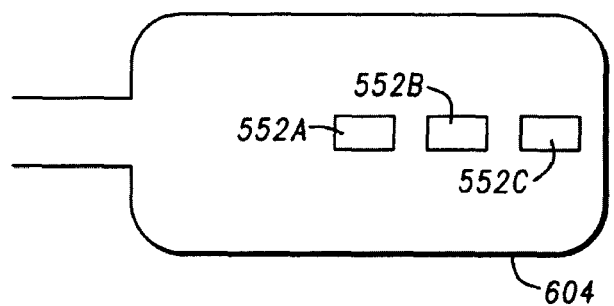
FIG. 42 is a top view of a portion of a semiconductor component in accordance with an embodiment of the present invention.

FIG. 41 is a top view of a capacitor plate such as, for example, plate 68 shown in cross-sectional view in FIG. 7. The shape of capacitor plate 68 can be triangular, square, pentagonal, hexagonal, or another polygonal shape. In addition, the shape can be circular, elliptical, or the like or a square shaped with one or more of the corners removed. What is shown in FIG. 42 is a capacitor plate that is an eight sided polygon, wherein the corners of the capacitor plate have internal angles of 135 degrees. Configuring the capacitor plates to have corners with angles of greater than 90 degrees inhibits delamination and cracking of the film layers comprising the passive circuit elements. It should be noted that the angle between two line segments or sides that intersect is greater than 90 degrees. Preferably, the angle is less than or greater than 90 degrees, i.e., not equal to 90 degrees.

FIG. 42 is a top view of a copper structure 604 that includes dielectric filled slots that help inhibit delamination. The slots may be formed by portions 552A, 552B, and 552C of dielectric layer 552 shown in FIG. 40.

Figure 43:
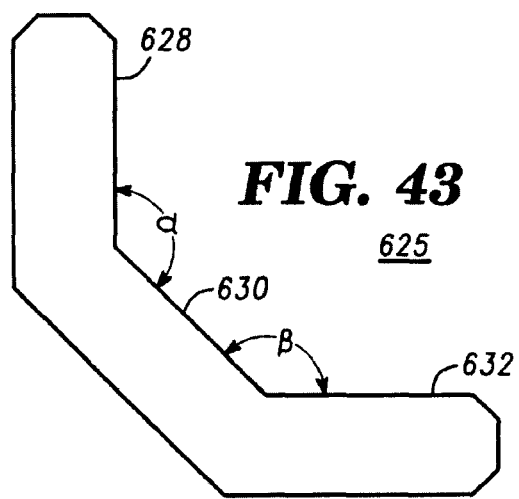
FIG. 43 is a top view of a portion of a semiconductor component in accordance with an embodiment of the present invention.

FIG. 43 is a top view of a portion 625 of an inductor winding in accordance with another embodiment of the present invention. Angle $\alpha$ which is formed by the intersection of line segments 628 and 630 is less than or greater than 90 degrees and angle and $\beta$ which is formed by the intersection of line segments 630 and 632 is less than or greater than 90 degrees, i.e., not equal to 90 degrees. Configuring the inductor windings to include line segments that form corners with angles of greater than 90 degrees inhibits delamination and cracking of the film layers comprising the passive circuit elements.

Figure 44:
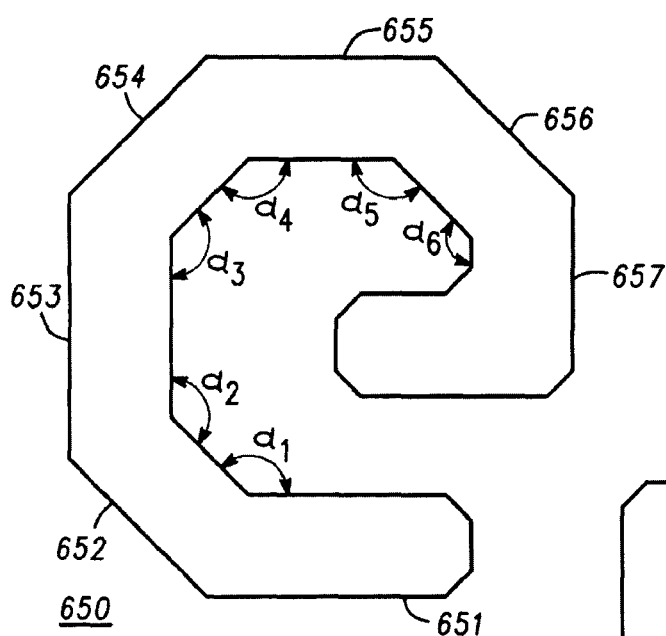
FIG. 44 is a top view of a portion of a semiconductor component in accordance with an embodiment of the present invention.

FIG. 44 is a top view of a portion 650 of an inductor winding in accordance with another embodiment of the present invention. Angles $\alpha_1$, $\alpha_2$, $\alpha_3$, $\alpha_4$, $\alpha_5$, and $\alpha_6$, which is formed by the intersection of line segments 651 and 652, line segments 652 and 653, line segments 653 and 654, line segments 654 and 655, line segments 655 and 656, and line segments 656 and 657 are each greater than 90 degrees and. Configuring the inductor windings to include line segments that form corners with angles of greater than 90 degrees inhibits delamination and cracking of the film layers comprising the passive circuit elements.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent requited by the appended claims and the rules and principles of applicable law.

What is claimed is:
1. A method for manufacturing a semiconductor component, comprising:
   providing a semiconductor material;

forming an amorphous region from a portion of the semiconductor material;

forming a first layer of dielectric material over the semiconductor material;

forming a first layer of electrically conductive material over the first layer of dielectric material;

forming a second layer of dielectric material over the first layer of electrically conductive material; and forming a first damascene structure from the second layer of dielectric material.

2. The method of claim 1, further including configuring a first portion of the first layer of electrically conductive material as a first plate of a capacitor.

3. The method of claim 2, further including:

forming a third layer of dielectric material over the first plate of the capacitor; and forming a second layer of electrically conductive material over the third layer of dielectric material to form the capacitor.

4. The method of claim 3, wherein forming the first damascene structure includes forming a first portion of the first damascene structure in contact with the second layer of electrically conductive material.

5. The method of claim 4, further including forming a fourth layer of dielectric material over the first damascene structure and forming a second damascene structure from the fourth layer of dielectric material.

6. The method of claim 5, further including configuring a first portion of the first damascene structure as a first portion of an inductor.

7. The method of claim 6, further including configuring a first portion of the second damascene structure as a second portion of the inductor.

8. The method of claim 7, further including forming a contact from second portions of the first and second damascene structures.

9. The method of claim 8, wherein the first and second damascene structures comprise copper and the contact comprises aluminum.

10. The method of claim 1, further including forming a resistor on a portion of the first layer of dielectric material.

11. The method of claim 10, wherein forming the first layer of electrically conductive material includes forming first and second portions of the first layer of electrically conductive material in contact with first and second portions of the resistor, respectively.

12. A method for manufacturing a semiconductor component, comprising:

providing a semiconductor material;

forming a first layer of dielectric material over the semiconductor material;

forming a first plurality of subportions of an inductor from the first layer of dielectric material using a first damascene process;

forming a second layer of dielectric material over the first plurality of subportions of the inductor;

forming a third layer of dielectric material over the semiconductor material, the third layer of dielectric material between the first layer of dielectric material and the semiconductor material;

forming a first layer of electrically conductive material over the third layer of dielectric material;

forming a fourth layer of dielectric material over the first layer of electrically conductive material;

forming a second layer of electrically conductive material over the fourth layer of dielectric material;

forming a second plurality of subportions of the inductor from the second layer of dielectric material using a second damascene process, wherein a first subportion of the first plurality of subportions cooperates with a first subportion of the second plurality of subportions to form a first segment of the inductor wherein forming the first plurality of subportions of the inductor includes forming a first conductor in electrical communication with the second layer of electrically conductive material.

13. The method of claim 12, wherein forming the second plurality of subportions of the inductor includes forming a second conductor in electrical communication with the first conductor.

14. The method of claim 13, wherein forming the second conductor further includes forming at least one dielectric structure within the second conductor.

15. The method of claim 13, wherein forming the first plurality of subportions of the inductor from the first layer of dielectric material using the first damascene process further includes forming second and third subportions of the plurality of first subportions and wherein forming the second plurality of subportions of the inductor from the second layer of dielectric material using the second damascene process includes forming second and third subportions of the second plurality of subportions, wherein second subportion of the first plurality of subportions cooperates with a second subportion of the second plurality of subportions to form a second segment of the inductor, and the third subportion of the first plurality of subportions cooperates with the third subportion of the second plurality of subportions to form a contact.

16. A semiconductor component, comprising:

a semiconductor material;

a first layer of dielectric material formed over the semiconductor material;

a first damascene structure formed from the first layer of dielectric material, the first damascene structure including first and second inductor portions and a first subportion of a conductor element;

a second layer of dielectric material formed over the first damascene structure;

a second damascene structure formed from the second layer of dielectric material, the second damascene structure including third and fourth inductor portions and a second subportion of the conductor element, wherein the first and third inductor portions cooperate to form a first segment of an inductor, the second and fourth inductor portions cooperate to form a second segment of the inductor, and the first and second subportions of the conductor element cooperate to form the conductor, wherein the first segment has first and second ends and wherein the inductor further includes a third segment having first and second ends, wherein the first end of the second segment extends from the second end of the first segment, and wherein an angle between the first and second segments is less than or greater than 90 degrees.

17. The semiconductor component of claim 16, wherein the angle is substantially 135 degrees.

18. A semiconductor component, comprising:

a semiconductor material;

a first layer of dielectric material formed over the semiconductor material;

a first damascene structure formed from the first layer of dielectric material, the first damascene structure including first and second inductor portions and a first subportion of a conductor element;

a second layer of dielectric material formed over the first damascene structure; a second damascene structure formed from the second layer of dielectric material, the second damascene structure including third and fourth inductor portions and a second subportion of the conductor element, wherein the first and third inductor portions cooperate to form a first segment of an inductor, the second and fourth inductor portions cooperate to form a second segment of the inductor, and the first and second subportions of the conductor element cooperate to form the conductor, and further including a capacitor formed between the semiconductor material and the first layer of dielectric material, wherein the capacitor comprises first and second plates and a third layer of dielectric material between the first and second plates, and wherein at least the first plate of the capacitor has sides that intersect and make an angle of less than or greater than 90 degrees.

19. A semiconductor component, comprising:

a semiconductor material;

a first layer of dielectric material formed over the semiconductor material;

a first damascene structure formed from the first layer of dielectric material, the first damascene structure including first and second inductor portions and a first subportion of a conductor element;

a second layer of dielectric material formed over the first damascene structure;

a second damascene structure formed from the second layer of dielectric material, the second damascene structure including third and fourth inductor portions and a second subportion of the conductor element, wherein the first and third inductor portions cooperate to form a first segment of an inductor, the second and fourth inductor portions cooperate to form a second segment of the inductor, and the first and second subportions of the conductor element cooperate to form the conductor, further including dielectric filled slots in the conductor element.

* * * * *